United States Patent
Ridges et al.

(10) Patent No.: US 10,021,177 B1
(45) Date of Patent: Jul. 10, 2018

(54) PEER-TO-PEER COMMUNICATIONS

(71) Applicant: Masque Publishing, Inc., Lone Tree, CO (US)

(72) Inventors: John C. Ridges, Highlands Ranch, CO (US); James M. Wisler, Lone Tree, CO (US)

(73) Assignee: MASQUE PUBLISHING, INC., Lone Tree, CO (US)

( * ) Notice: Subject to any disclaimer, the term of this patent is extended or adjusted under 35 U.S.C. 154(b) by 93 days.

(21) Appl. No.: 15/004,130

(22) Filed: Jan. 22, 2016

Related U.S. Application Data

(63) Continuation of application No. 13/028,698, filed on Feb. 16, 2011, now Pat. No. 9,270,784.

(51) Int. Cl.
*G06F 15/17* (2006.01)
*H04L 29/08* (2006.01)
*H04L 12/24* (2006.01)

(52) U.S. Cl.
CPC ........ *H04L 67/1051* (2013.01); *H04L 41/083* (2013.01); *H04L 41/0826* (2013.01)

(58) Field of Classification Search
CPC ............. H04L 67/1051; H04L 41/0826; H04L 41/083
See application file for complete search history.

(56) References Cited

U.S. PATENT DOCUMENTS 4,316,283 A   2/1982  Ulug
5,539,741 A   7/1996  Barraclough et al.
(Continued)

FOREIGN PATENT DOCUMENTS

WO   WO 2005/086451   9/2005

OTHER PUBLICATIONS

"Macromedia Enables Third Parties to Support Macromedia Flash: Software Development Kits Extend Macromedia Flash to Devices and New Applications," PR Newswire Assn, 2000, 3 pages.
(Continued)

*Primary Examiner* — John MacIlwinen
(74) *Attorney, Agent, or Firm* — Sheridan Ross P.C.

(57) ABSTRACT

A peer-to-peer (p2p) communication system is provided. One or both of audio and video can be transferred among a number of user terminals in the p2p system. The user terminals include at least one master terminal. The master terminal controls video or audio, or both, transfers among user terminals. The master terminal is identified, based on a determined topology, using obtained information provided in a data parameters table. Each user terminal includes a control for processing video and/or audio that is sent/received by the user terminal. Such processing can include encoding/decoding of video and/or audio. The master terminal control can process the same video and generate different video data to be provided to different user terminals. Such different video data is a function of the communication paths between the master terminal and the different user terminals. The master terminal control can also process the same audio and generate different audio data to be provided to different user terminals. Such different audio data can be a function of virtual relative positions associated with the user terminals. Audio volumes can also be separately controlled by each user terminal, including turning off audio volumes associated with one or more other user terminals. Similar controls can be provided for identity-related video images. Video and/or audio can be transferred in an aggregate manner, such as when the master terminal sends audio originating from a number of user terminals to another user terminal. In one embodiment, the master terminal control includes a Flash Player already configured to communicate with numerous webcams. This p2p system can be utilized with online game playing in which a game server is included, as well as having other communication applications.

22 Claims, 14 Drawing Sheets

(56) References Cited

U.S. PATENT DOCUMENTS

| | | |
|---|---|---|
| 6,230,130 B1 | 5/2001 | Castello da Costa et al. |
| 6,408,327 B1 | 6/2002 | McClennon et al. |
| 6,625,643 B1 | 9/2003 | Colby et al. |
| 7,379,450 B2 | 5/2008 | Gu et al. |
| 7,464,272 B2 | 12/2008 | Danieli |
| 7,515,560 B2 | 4/2009 | DuMas et al. |
| 7,653,250 B2 | 1/2010 | Jeong et al. |
| 7,692,682 B2 | 4/2010 | Pun et al. |
| 7,817,180 B2 | 10/2010 | Jeong et al. |
| 7,852,831 B2 | 12/2010 | Akbar |
| 7,864,209 B2 | 1/2011 | Jeong et al. |
| 7,949,117 B2 | 5/2011 | Jeong et al. |
| 7,987,233 B1 | 7/2011 | Osborne et al. |
| 8,289,370 B2 | 10/2012 | Civanlar et al. |
| 8,370,732 B2 | 2/2013 | Black et al. |
| 8,452,014 B2 | 5/2013 | Ratliff et al. |
| 8,638,690 B2* | 1/2014 | Javaid ............... H04L 45/302 370/254 |
| 8,838,722 B2 | 9/2014 | Ridges et al. |
| 9,270,784 B2 | 2/2016 | Ridges et al. |
| 2003/0074674 A1* | 4/2003 | Magliaro ............. H04N 7/15 725/118 |
| 2003/0105812 A1 | 6/2003 | Flowers, Jr. et al. |
| 2003/0112947 A1 | 6/2003 | Cohen |
| 2003/0185186 A1 | 10/2003 | Tsutsumi et al. |
| 2003/0204509 A1* | 10/2003 | Dinker ............. G06F 17/30575 |
| 2003/0217135 A1 | 11/2003 | Chatani et al. |
| 2005/0049049 A1 | 3/2005 | Griswold et al. |
| 2005/0132154 A1 | 6/2005 | Rao et al. |
| 2005/0201310 A1 | 9/2005 | Fujioka |
| 2005/0237377 A1 | 10/2005 | Chapweske et al. |
| 2005/0262216 A1 | 11/2005 | Kashiwabara et al. |
| 2006/0217201 A1 | 9/2006 | Berstis et al. |
| 2006/0245379 A1 | 11/2006 | Abuan et al. |
| 2006/0258450 A1 | 11/2006 | Ishihata et al. |
| 2006/0271702 A1* | 11/2006 | Canali ............... H04Q 11/0478 709/238 |
| 2007/0149278 A1 | 6/2007 | Walker et al. |
| 2007/0165106 A1 | 7/2007 | Groves et al. |
| 2007/0237089 A1 | 10/2007 | Chen et al. |
| 2008/0045286 A1 | 2/2008 | Setty |
| 2008/0133437 A1 | 6/2008 | Shaw et al. |
| 2008/0134170 A1 | 6/2008 | Astheimer |
| 2008/0172463 A1 | 7/2008 | Qin et al. |
| 2009/0300685 A1 | 12/2009 | Easter |
| 2010/0042668 A1 | 2/2010 | Liang et al. |
| 2010/0135094 A1 | 6/2010 | Won |
| 2010/0162036 A1* | 6/2010 | Linden ............... G06F 11/181 714/4.11 |
| 2010/0169498 A1* | 7/2010 | Palanki ............... H04W 16/14 709/228 |
| 2010/0262709 A1 | 10/2010 | Hiie et al. |
| 2010/0329463 A1 | 12/2010 | Ratliff et al. |
| 2011/0060798 A1 | 3/2011 | Cho et al. |
| 2011/0069643 A1 | 3/2011 | Yoakum et al. |
| 2011/0116409 A1 | 5/2011 | Jeong et al. |
| 2011/0145341 A1 | 6/2011 | Hampel |
| 2011/0252090 A1 | 10/2011 | Garcia, Jr. et al. |
| 2011/0252157 A1 | 10/2011 | Garcia, Jr. et al. |
| 2011/0304497 A1 | 12/2011 | Molyneux et al. |
| 2011/0306290 A1 | 12/2011 | Fukuzawa et al. |
| 2012/0004041 A1* | 1/2012 | Pereira ............... A63F 13/35 463/42 |
| 2012/0020242 A1* | 1/2012 | McLaren ............... H04L 41/12 370/254 |
| 2012/0155386 A1 | 6/2012 | Krishnaswamy et al. |
| 2012/0155646 A1 | 6/2012 | Seshadri et al. |
| 2012/0306290 A1 | 12/2012 | Fanget |
| 2014/0347437 A1 | 11/2014 | Ridges et al. |

OTHER PUBLICATIONS

Akkus et al., "Peer-to-Peer multipoint video conferencing with layered video," J. Network & Computer Applications, 2011, vol. 34, pp. 137-150.

Duffez et al., "DSP Implementation of On-Board Image Compression Algorithm," 2001, pp. 1-8.

Kotilainen et al., "P2PStudio-Monitoring, Controlling and Visualization Tool for Peer-to-Peer Networks Research," ACM New York, USA, 2006, pp. 9-12.

Liu et al., "Immersive Peer-to-Peer Audio Streaming Platform for Massive Online Games," Consumer Communications and Networking Conference, 2006, $3^{rd}$ IEEE (vol. 2), 5 pages.

Yang et al., "TEEVE: The Next Generation Architecture for Tele-immersive Environments," Proceedings of the Seventh IEEE International Symposium on Multimedia, 2005, 8 pages.

Yu, "A Scalable Overlay Video Mixing Service Model," ACM 1-58113-722-2/03/0011, MM'03, Nov. 2-8, 2003, 2 pages.

Official Action for U.S. Appl. No. 13/028,698, dated Apr. 11, 2013, 85 pages.

Final Action for U.S. Appl. No. 13/028,698, dated Oct. 15, 2013, 62 pages.

Official Action for U.S. Appl. No. 13/028,698, dated Jun. 12, 2015, 72 pages.

Notice of Allowance for U.S. Appl. No. 13/028,698, dated Oct. 30, 2015, 16 pages.

Official Action for U.S. Appl. No. 372,645, dated Sep. 25, 2013, 19 pages.

Notice of Allowance for U.S. Appl. No. 372,645, dated May 15, 2014, 13 pages.

Official Action for U.S. Appl. No. 14/458,369, dated Oct. 23, 2015, 23 pages.

\* cited by examiner

DATA PARAMETERS TABLE

| | PARAMETER 1 (e.g. BANDWIDTH) | PARAMETER 2 (e.g. LATENCY) | PARAMETER 3 (e.g. COMPUTING POWER) | PARAMETER n (e.g. NODE UNRELIABILTIY) | PARAMETER 1 | PARAMETER 2 | PARAMETER 3 | PARAMETER n | PARAMETER 1 | PARAMETER 2 | PARAMETER 3 | PARAMETER n | PARAMETER 1 | PARAMETER 2 | PARAMETER 3 | PARAMETER n |
|---|---|---|---|---|---|---|---|---|---|---|---|---|---|---|---|---|
| | $UT_1$ | | | | $UT_2$ ... | | | | $UT_m$ ... | | | | $UT_n$ | | | |
| $UT_1$ | ╳ | | | | | | | | | | | | | | | |
| $UT_2$ ... | | | | | ╳ | | | | | | | | | | | |
| $UT_m$ ... | | | | | | | | | ╳ | | | | | | | |
| $UT_n$ | | | | | | | | | | | | | ╳ | | | |

Fig. 4

PEER-TO-PEER COMMUNICATIONS

RELATED APPLICATION

This application is a continuation of pending U.S. patent application Ser. No. 13/028,698, filed Feb. 16, 2011 and entitled "PEER-TO-PEER COMMUNICATIONS."

FIELD OF THE INVENTION

The present invention relates to voice and/or video communications involving at least one peer-to-peer system that includes a number of user terminals and, in particular, to providing one or both of voice and video communications among the user terminals based on their communication capabilities.

BACKGROUND OF THE INVENTION

Online communications, particularly by means of the Internet, include streaming video and audio. Products that enable the presentation of such video and audio include the Adobe Flash Player. The Flash Player can be used in conjunction with a web browser to provide video and audio on a web site for selectable viewing. Also available from Adobe is its Flash Media Server, which can function as a control or central server for a number of Flash Players, such as when playing an online game. In such an application, the Flash Media Server and the Flash Players are part of a network in which users of the Flash Players play a Flash-based multi-player, multimedia game. Game play is communicated among the Flash Players utilizing the Flash Media Server as a hub.

Known peer-to-peer communication systems provide multi-party communications by means of voice-over-Internet protocol (VoIP). In that regard, a communication system has been devised for communicating video, audio and file data, among a plurality of communication devices or nodes, while not relying on a central server, as disclosed in Pub. No. US 2010/0262709 A1 to Hiie et al., published Oct. 14, 2010 and entitled "Optimising Communications."

In view of the increasing popularity of online audio and/or video communications, it would be advantageous to utilize at least certain aspects of available technologies to effectively, and with reduced complexity and cost, provide one or more of audio and video communications in a peer-to-peer system.

SUMMARY OF THE INVENTION

In accordance with the present invention, a peer-to-peer (p2p) system is provided which includes user terminals that are able to bi-directionally communicate with each other using at least one of audio and video. A user terminal capable of video communications has a video input device, such as a video camera or webcam and a video output device, such as a display device or video monitor. A user terminal capable of audio communications has an audio input device, such as a microphone, and an audio output device, such as one or more audio output speakers. Each user terminal has a control, or a video/audio (one or both of video and audio) control, which controls the video and/or audio to be output by that user terminal to at least one other user terminal. The video/audio control preferably includes a Flash Player, or at least portions thereof or features associated therewith, which is responsible for handling or managing the video that it receives via its user terminal video input device. Typically, the Flash Player, as part of its control functions, encodes the video in so that it is in a desirable or acceptable video format for sending to another user terminal. In addition to the Flash Player, the control includes a control module that communicates with the Flash Player. The control module is basically comprised of software, as is the Flash Player. With respect to the video encoding operations, the control module has a control output or signal that it provides to the Flash Player for use in regulating the extent of encoding, such as the amount or degree of video compression including any deletion of determined video portions. Such encoding depends on the communication capabilities or characteristics associated with the communications paths or channels between the particular user terminal providing such encoded video and the user terminal that is to receive it.

In that regard, in an embodiment in which at least video is being communicated, different video data can be generated from the same video that is received or provided by the originating video input device. Such different video data can be sent to two or more other user terminals. More specifically, at least one user terminal in the p2p system is determined to be a master or control terminal, which is responsible for video to be sent to other user terminals including video that is provided originating from the master terminal's video input device. In addition to its own video data, the master terminal may receive video data from two or more other user terminals (e.g., "slave" or non-master terminals) in the system. Such video data is processed or controlled by the master terminal to generate processed video data to be sent to user terminals for use in displaying video. For example, the master terminal might be responsible for sending its own processed video data to two other user terminals, as well as sending processed video data associated with the first user terminal to the second user terminal for display and sending processed video data associated with the second user terminal to the first user terminal for display. The master terminal can process the video data so that the processed video data sent to one user terminal is different from the processed video data sent to another user terminal. The determined differences are essentially based on the communication paths between the master terminal and the other user terminals, particularly the bandwidths, latencies, user terminal computational or processing power and/or other performance characteristics or factors associated with each of such paths. Based on these factors, by way of example, the processed video data associated with the master terminal and sent by it to a first user terminal, in comparison with the processed video data also associated with the master terminal and sent by it to a second user terminal, may have experienced or undergone different processing, such as more or less video compression, which can include deletion of different video portions depending on which terminal the processed video is to be sent. As a result, the video data, which is based on the video received by the master terminal video input device, that is used by the first and second user terminals to provide video displays can be different, even though the video data used by the master terminal to generate the different processed video data is the same.

In an embodiment in which audio is output by audio output devices of the user terminals, the video/audio control of each user terminal, including the master terminal, can be used to regulate the volume of the audio that is output by the user terminal audio output devices, such as their audio speakers. Such audio volume control can result in audio volumes being dependent on virtual positions that are associated with each user terminal relative to the other terminals in the particular p2p system. When playing an online game, for example, each user terminal (and accordingly the player utilizing that user terminal) can be assigned a relative table position prior to the game, or a round of the game, being played. Second and third players, respectively, could be positioned to the left and right of a first player. A fourth player could be positioned directly across from the first player. When playing an actual game, the voice or audio received by the first player depends on a number of factors including the relative positions of the players. The first player hears voice from the second player differently than voice from the third player due, at least in part, to their virtual table positions. The user terminal control can be used to emulate such differences. Audio volume that is output by the master terminal to another user terminal can be controlled so that the audio volume associated with a first speaker for such a user terminal is different than the audio volume associated with a second speaker of that user terminal. The difference in audio volumes is based on the relative positions of that user terminal and the user terminal that is the source of the audio. By means of such position determinations and controls, audio heard by online game players emulates actual game play voice communications.

Regulation of audio also includes being able to turn off the volume associated with the audio that can be received by each player from other players, as well as adjusting the audio volume received from one or more other players to a desired level. More specifically, the level, degree or magnitude of the audio volume of one or more user terminals can be controlled. The communications user (or player when a game is being played during the communications) may want to individually, separately or independently control the audio volume it is to receive or use from one or more of the user terminals that are part of that user's particular communication system. That is, the communications user may want the level of the audio volume that is output by his or her user terminal audio output device to be different in respect to one or more of the audio volumes that it uses from other user terminals, including having the control to separately turn off (audio volume becomes essentially zero or no audio volume is able to be heard) the audio volume associated with one or more user terminals. As can be understood, controls can additionally, or alternatively, be provided that allow each user terminal to similarly turn off, not display, not send/receive, or otherwise not use one or more video images related to identity-related information associated with other user terminals. Such identity-related information can take the form of a user's face, an avatar, or any other image that the user may provide related to his or her identity.

In the embodiment in which at least audio is communicated, the user terminals process audio data. Such processing is important to achieve desired audio quality, regardless of the communications paths among the various user terminals. The master terminal receives audio data from other user terminals after being processed by them, including audio data that has been compressed based on the communication path to the master terminal. Such compressed audio data is typically decoded (e.g. decompressed) and encoded again by the master terminal control, which further encoding depends on the communications/performance capabilities/factors related to the communication paths between the master terminal and the other user terminals to which audio data is to be sent. Such audio data compression (by a user terminal), and de-compression and another, but typically different, compression (by a master terminal) contrasts with the video data processing embodiment. That is video data is compressed usually one time by producing a reduced quantity of data that represents the originally provided video data, while allowing for such reduced data to be de-compressed so that all original data is substantially recoverable with acceptable image degradation. Such compression is done by means of the user terminal from which the video data originates; however, the master terminal has the capability of deleting video data that it has received from one terminal before sending it to another terminal. Additionally, in the embodiment in which both audio and video are communicated, to assist in aligning audio data with concurrently generated video data so that the video ultimately being displayed corresponds with its associated audio output from the audio speaker(s), it is preferred that the audio data and video data, when both are being generated, be aggregated and output together. Whenever aggregated, the sending of audio data has priority over the sending of video data. Video data is included in the packets of frames of data being sent when such packets have space for the video data. Related to synchronizing audio data and its associated video data, when the master terminal encodes or compresses audio data after first decoding it, it is usually the case that the associated video data is located in one or more positions in one or more packets of one or more packet frames that are different than their position(s) when such video was received with its associated audio by the master terminal. Because of this encoding transformation, and in order to maintain an accurate sync between audio and video data, irrespective of the different video data packet locations, it is necessary to keep track of such video data in the packets by utilizing a time correlation marker or markers, a time stamp or the like, so that the user terminal receiving such data can properly match such video data with its associated audio data, regardless of their differing locations.

With regard to providing communication (one or both of audio and video) paths among particular user terminals, a peer-to-peer system or network is established using data stored in a data parameters table. Such data relates to communication factors or characteristics associated with each communication path, such as the previously noted bandwidth, latency and/or computational or processing power. Such data is used with one or more algorithms, which can be termed a "fitness" function, to determine fitness values. There is one fitness value determined for each topology that can be associated with the particular user terminals that wish to communicate with each other. Each topology for particular user terminals of a particular peer-to-peer system relates to connections among such user terminals. Based on possible connections, more than one possible topology can be defined. A determined topology, which is the topology to be used for the particular user terminals, is determined using the fitness values found using different topologies for such user terminals. From a comparison of the fitness values, a selected fitness value is determined. Based on the selected fitness value which, in one embodiment, may be the lowest or smallest fitness value of such determined fitness values, the determined topology, including its master(s), is determined or identified. Once a particular one topology is determined and communications are occurring using such topology, updated data continues to be obtained and provided with the data parameters table. Further similar determinations are made, but using such new data, related to determining a possibly different topology for the same user terminals. If or when the particular peer-to-peer system changes, e.g., one of the user terminals is no longer part of that system and/or a new user terminal is to communicate with other user terminals already communicating using the previously determined topology, another new topology is similarly determined, which is different than the immediately previous topology. With regard to changing to a different topology, whether such change is made due to the addition and/or deletion of a user terminal or due to a "better" topology being determined for the same user terminals, any communications during the transition seamlessly occur. That is, each user of the user terminals continues to communicate as if no change was occurring and each such user does not notice any change being made. Generally, each individual user terminal continues to utilize the present topology until such user terminal receives information to the effect that the topology has changed. After a particular user terminal has such information indicative of a different topology, such user terminal begins utilizing the different topology including sending communications based thereon, instead of the immediately previous topology.

The present invention, therefore, provides novel ways of communicating one or both of voice and video in a p2p system. Each p2p system is established with a number of user terminals, at least one of which is determined, based on a determined topology, to be a master terminal for handling communications involving other user terminals, including such communications to/from the master terminal itself. The user terminals communicate with each other via communication channels that can differ in their performance capabilities. Consequently, quality characteristics of the outputs from the user terminals can vary depending on such factors as bandwidths and delays. User terminal audio outputs can be controlled. Such control can include audio heard by game players, or other users, being a function of their relative positions, such as positions around a virtual game-playing table. Such control can comprise, additionally or alternatively, independently controlling the audio level associated with each audio volume from each user terminal, including turning off one or more audio volumes. Such audio control(s) can be provided with a p2p system, or can be provided in one or more systems that are not p2p systems. Transmitting audio outputs when a master terminal is used results in bandwidth savings. The master terminal is able to aggregate or combine audio from more than one slave terminal before such aggregated audio is sent to a desired slave terminal, thereby saving bandwidth. This contrasts with a p2p system in which each audio stream is sent using its own separate audio channel. Related to aggregating audio, in an embodiment when both are being generated, audio and video are combined in connection with achieving desired correspondence between them at the eventual audio and video outputs. Although other embodiments can be provided, it is preferred that, when communicating video, each user terminal control includes a Flash Player, which is already configured for use with a variety of webcams. With respect to establishing each particular p2p system, a particular topology is determined using data associated with a data parameters table. Based on the determined topology, one or more master terminals is determined or identified. Numerous applications of the present invention are contemplated including use during online game playing, as well as for typical voice, as well as voice with video, conversations (such as conference calls) over the Internet. New applications can also be developed, such as to provide communications among various users while they are playing slots in casinos.

Additional advantages of the present invention are readily apparent, particularly when taken together with following descriptions including the accompanying drawings.

BRIEF DESCRIPTION OF THE DRAWINGS

FIG. 4 is a data parameters table illustrating various parameters for possible use in determining one or more master terminals from among the user terminals of the p2p system;

DETAILED DESCRIPTION

Figure 1:
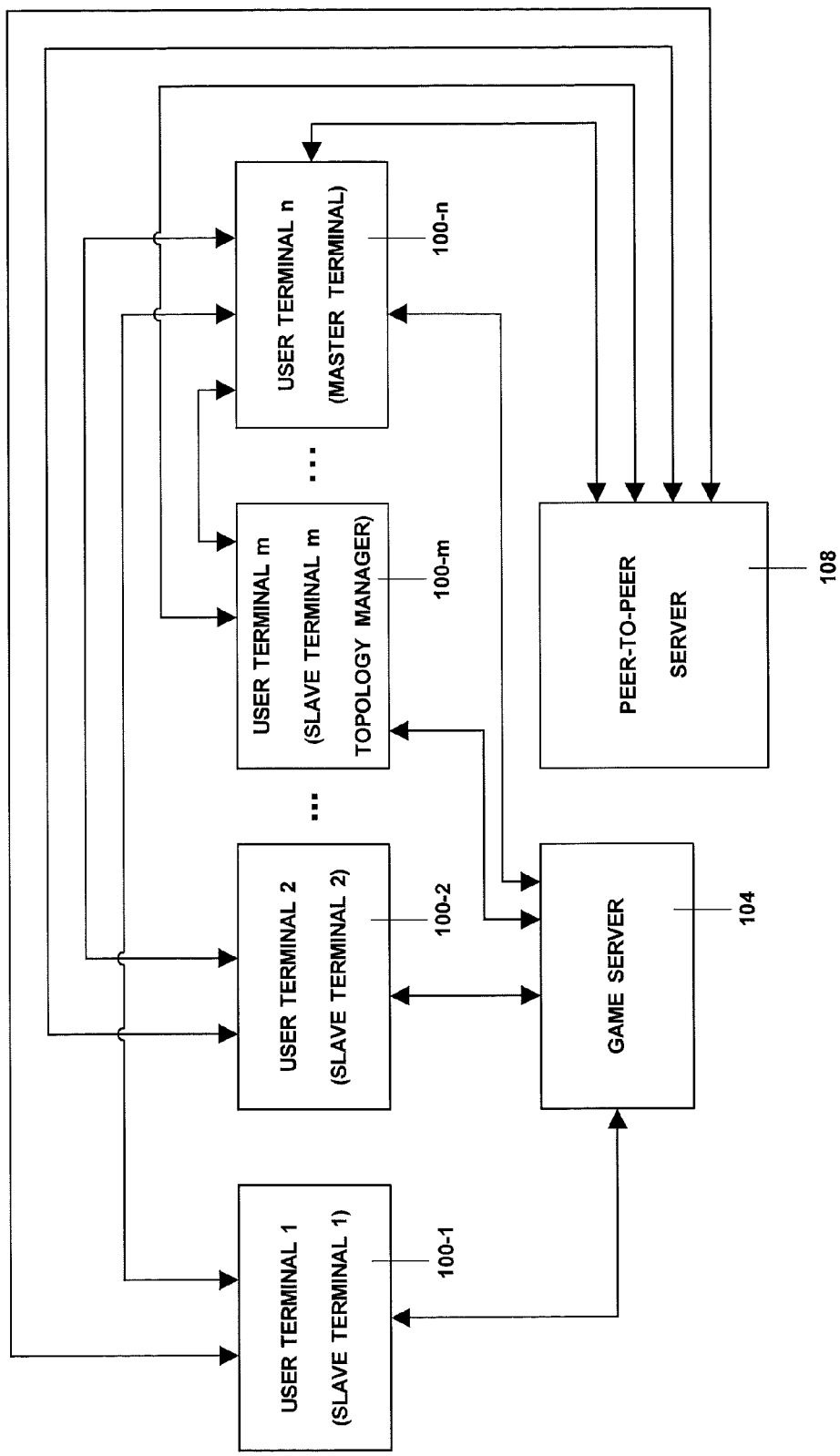
FIG. 1 is a block diagram that illustrates user terminals included in a peer-to-peer system of the present invention.

With reference to FIG. 1, one preferred embodiment of a peer-to-peer (p2p) communication system is illustrated. The system has a plurality of user or client terminals (UTs) 100 including UTs 100-1, 100-2, 100-*m*, 100-*n*. The user terminals 100 can be comprised of different communication apparatuses, such as desktop computers, laptops, smart devices, cell phones etc. The particular UTs 100-1 . . . 100-*n* are determined or established as part of a p2p system, according to one preferred implementation, utilizing a game server 104 and a peer-to-peer (p2p) server 108. The game server 104 and the p2p server 108 are useful in enabling the UTs 100 to exchange video and/or audio communications among themselves. The game server 104 is used in controlling game play among multiple users or players, who use one of the UTs 100 to communicate with the game server 104, in order to play one or more selected games. Such games can include, by way of example only, card, casino, board and puzzle games. The players, using their UTs 100, access the game server 104 including when they select a particular game they want to play. Such access can be accomplished online using a web browser. Typically, as part of the game playing process, each player is registered with the game server 104 so that the game server 104 recognizes the player as being authorized and authenticated, or otherwise being allowed, to play one or more games controlled by the game server 104. In the context of the present invention, the game server 104 is involved with providing areas, such as virtual tables, whereby multiple players can participate in the same game, as well as rounds of the game, and communicate (verbally and/or visually) with each other while playing the game, e.g. while playing poker at a particular, virtual table.

Regarding the establishment of p2p communications among the user terminals 100, the p2p server 108 communicates with the game server 104 including providing the p2p server 108 with player information, such as appropriate credentials indicative of such players being part of a group that has been set up by the game server 104 to play a particular game. The communication exchanges also include information related to the UTs 100 of the players so that the p2p server 108 can communicate directly with one of more of them, as part of the process (described later) that enables them to communicate with each other.

Figure 2:
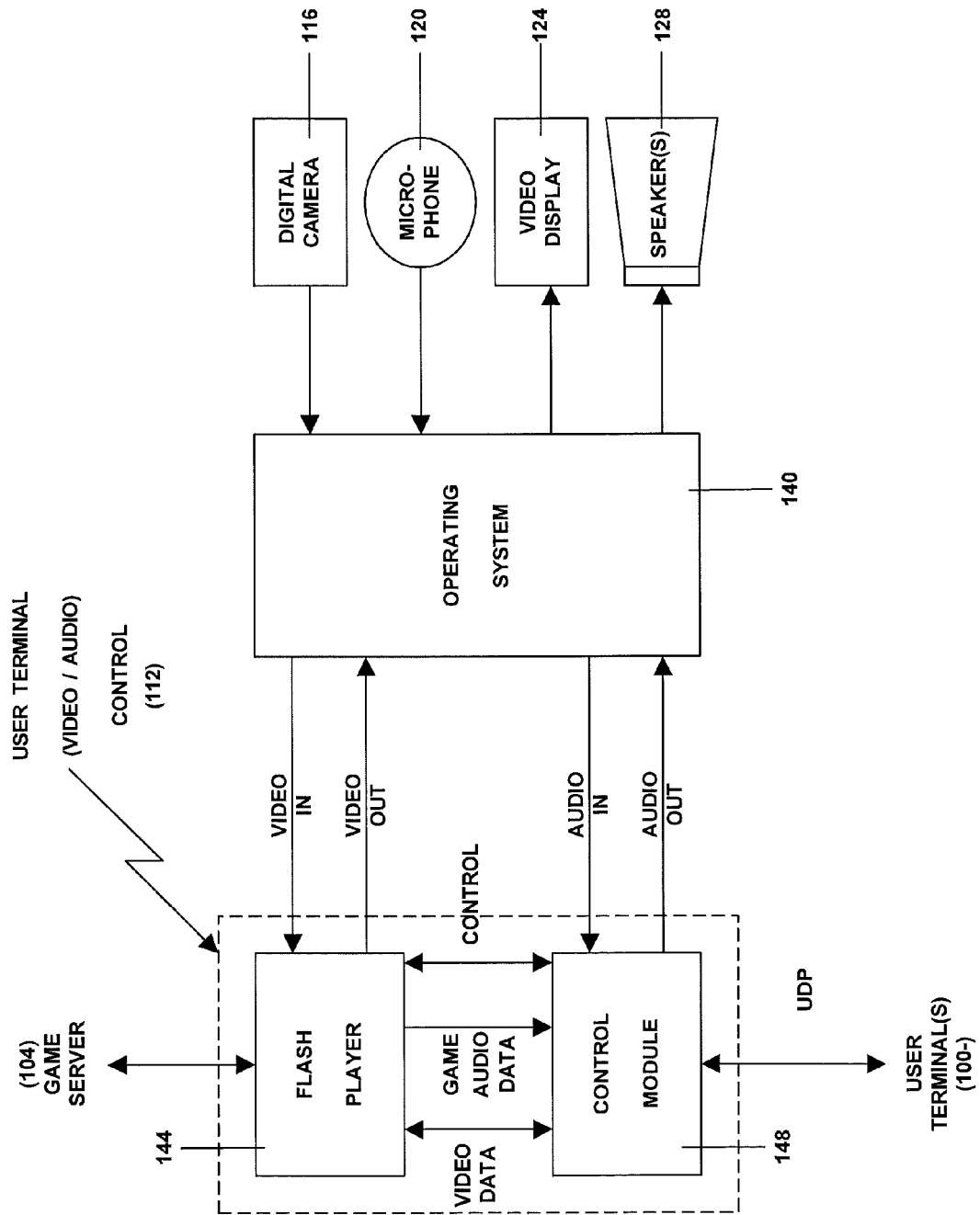
FIG. 2 is a block diagram of a representative user terminal.

Referring to FIG. 2 also, a representative user terminal 100 is depicted, which includes a user terminal (UT) control 112. In the preferred embodiment, this control is a video/audio control used in controlling outputs associated with video and audio information that the UT control 112 receives. The UT control 112 includes one or more commercially available video codecs for compressing and decompressing video signals. The UT control may also include one or more known and available codecs for compressing/decompressing audio signals, when such compression and/or decompression is necessary or appropriate.

With respect to the video and audio signals, each user terminal 100 can include one or more video input devices, audio input devices, video output devices and audio output devices. In one embodiment, the video input device is a digital camera or webcam 116; the audio input device is a microphone 120; the video output device is a video display or screen 124, such as a computer video screen; and the audio output device includes two stereophonic speakers 128, although such a device could include more speakers or only one speaker. The user terminal 100 also has an operating system 140, which typically is part of the communication apparatus that constitutes the user terminal 100. The operating system 140 manages the video and/or audio inputs and outputs relative to the devices 116, 120, 124, 128 and supervises the signal processing functions associated with such video and audio, which is conducted using the UT control 112. Generally, the operating system 140 manages, organizes and directs, among other things, the video and/or audio signals relative to their respective input and output devices. In that regard, video and/or audio are communicated between the operating system 140 and the video/audio control 112 of the user terminal 100, pursuant to the managing, organizing and directing of the operating system 140. Prior to being encoded, and after being decoded, using the video/audio control 112, such video and audio signals are handled by the operating system 140 as part of its responsibilities in facilitating communications from/to the video and audio input devices and output devices 116, 120, 124, 128.

With respect to the illustrated user terminal 112, in a preferred embodiment it can be described as including a Flash Player 144 and a separate control module 148, which is compatible or workable with the Flash Player 144. The Flash Player 144 is a known and commercially available unit that executes using an ActionScript programming language. One of the conventional characteristics of this unit is that it is useful in receiving and sending video to a variety of different video input and output devices. Among its functions, the Flash Player 144 compresses and decompresses video data and is able to communicate compressed video data to other apparatuses. For example, in one prior art application, the Flash Player is able to communicate video and audio data with a Flash Media Server, which controls transfer of such data relative to other apparatuses having Flash Players. With regard to the present invention, the Flash Player 144 need not have or utilize all features or functionalities of the commercially available Flash Player 144; however, the Flash Player 144 does include functions associated with being able to handle video inputs and provide video outputs that are compatible with different video input devices, such as commercially available webcams.

In another embodiment, the user terminal control 112 does not include the Flash Player 144, or any portion thereof. Rather, the control module 148 by itself is devised to provide any functions or features that were provided by the Flash Player 144, such as encoding/decoding video information. As previously described, the user terminal control 112 is preferably a control that can control both video and audio. However, in other embodiments, the present invention could have a user terminal control that functions with video, and not audio. Likewise, a user terminal control could be provided that functions with audio, and not video.

Continuing to refer to FIG. 2, as well as FIG. 1, each of the user terminals 100 communicates with the game server 104. Additionally, each of the user terminals communicates with one or more of the other user terminals 100, such as by means of the control module 148 and via user datagram protocol (UDP). Such communications are part of the peer-to-peer network or system illustrated in FIG. 1. In that regard, instead of using a server different from the user terminals 100 for managing communications among the user terminals 100, one of the user terminals 100, which is part of the communications network being established, is determined to be the central server that is responsible for handling communications among the user terminals 100 that are part of such a network. As illustrated in FIG. 1, user terminal n 100-*n* is determined to be the central or master terminal. The other user terminals including 100-1, 100-2 . . . 100-*m* are determined to be subordinate or slave terminals, each of which communicates directly with the user terminal n 100-*n* (master terminal) and do not communicate directly with each other. Rather, video and/or audio communications are transferred among such user terminals 100-1, 100-2 . . . 100-*m* under control of the master terminal 100-*n*.

Figure 3:
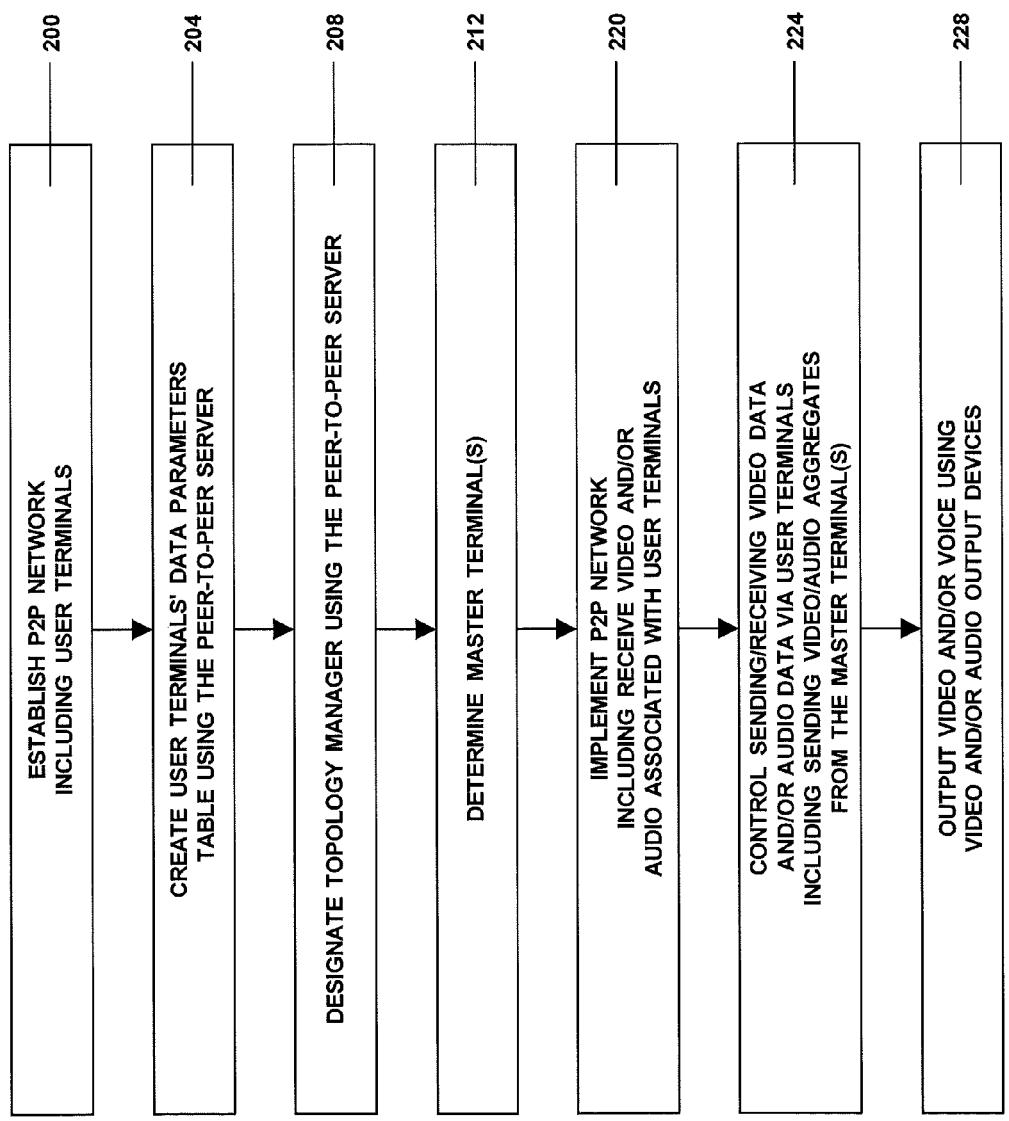
FIG. 3 is a flow diagram related to providing at least one of video and voice in the p2p system.

Regarding the basic steps related to determining which of the user terminals 100 is to be the master terminal 100-*n* and which are to be the slave terminals 100-1 . . . 100-*m* . . . , reference is made to the step diagram of FIG. 3. At step or block 200, a particular peer-to-peer network is first established. With respect to the preferred embodiment of FIG. 1, this is accomplished when a number of users (e.g. players) accessing their user terminals 100 want to play a selected game together, as well as have video and/or audio communications during playing of the game. For example, such players can take appropriate steps to play the selected game using the same virtual table. Each of the players is able to access the game including the game server 104 using a web browser that is operable with her/his user terminal 100, provided that they are authorized and authenticated to play the game. In that regard, the game server 104 stores appropriate identification information for each of the players, from which determinations can be made related to each player being (or not being) authorized and authenticated to play the game. Regarding the video and/or audio communications that might be transferred among the players, the software that constitutes the user terminal video/audio control 112, can be provided to the game players' user terminals 100, if not previously downloaded or otherwise provided to them. Such user terminal control software also enables the peer-to-peer server 108 to communicate with each of such user terminals 100 that are to be part of this particular p2p network. In addition to being involved with establishing each p2p network comprised of specific user terminals 100, the peer-to-peer server 108 has responsibility for creating a data parameters table, in accordance with block 204. Generally, the data parameters table includes information associated with the communication capabilities or characteristics of each of the user terminals 100-1, 100-2 . . . 100-*m* . . . 100-*n*. The main objective for obtaining such information is to use it in determining which of the user terminals 100 is to be the master terminal, while the remaining user terminals 100 of the particular network are deemed to be the slave terminals. Such determinations are made as a result of determining the topology of the particular p2p network since the master(s) and slave(s) are known by the determined topology. In the illustrated embodiment, user terminal n is determined to be the master terminal 100-*n*, while the remaining user terminals 100, 100-1, 100-2 . . . 100-*m* are the slave terminals. The master terminal 100-*n* communicates directly with each of the slave terminals 100-1 . . . 100-*m*. Conversely, the slave terminals 100-1 . . . 100-*m* do not communicate directly with each other, but communicate with each other using the master terminal 100-*n*. It should also be understood that, in other embodiments, there can be more than one master terminal, depending on the user terminals that are to be part of the particular p2p network.

After completion of the data parameters table, the peer-to-peer server 108 initiates steps to identify a topology manager as indicated by block 208. The topology manager is one of the user terminals 100 of the p2p network and is chosen or determined by the peer-to-peer server 108. In the illustrated embodiment, the user terminal m 100-*m* is designated by the peer-to-peer server 108 to be the topology manager. In one embodiment, the peer-to-peer server 108 identifies the topology manager in an arbitrary or random manner. That is, any one of the user terminals 100 could be arbitrarily designated as the topology manager. In another embodiment, a determination of which user terminal 100 is to be the topology manager is accomplished by relying on one or more predetermined factors, such as related to the geographic location of such a topology manger relative to the other user terminals and/or its bandwidth capabilities. Once designated as the topology manager, the user terminal 100-*m* is responsible for maintaining the data parameters table of its p2p network as it may change with time. The designated topology manager is provided with the complete initial data parameters table by the peer-to-peer server 108. This process speeds up the initial creation of the p2p network. The peer-to-peer server 108 also provides information to the topology manager related to any user terminal 100 being added later to the previously established p2p network and information related to any user terminal 100 being dropped from, or discontinued as being part of, the particular p2p network.

With reference also to FIG. 4, a representative data parameters table is presented. The data parameters table is determined or generated for each particular peer-to-peer network, based on information related to communication factors or capabilities involving the user terminals 100. The user terminal 100, which is designated by the peer-to-peer server 108, as the topology manager, such as user terminal m 100-*m*, assumes responsibility for maintaining such parameters after they are provided to it by the peer-to-peer server 108 as just described. In one embodiment, there can be n parameters that are determined. These parameters can relate to, for example, bandwidth, latency and/or terminal computational/processing power or capabilities associated with sending a known or predetermined test packet(s) of data between two user terminals 100, i.e. for each pair of user terminals 100 that are defined in the particular p2p network (associated with a particular topology), the same, known packet(s) is(are) transferred for comparison purposes. The bandwidth relates to the data transfer rate(s) between two particular terminals and preferably involves use of, or depends on, the number of audio and video channels (communication paths using which audio and/or video data is sent or received) associated with each particular user terminal; the latency refers to the communications delay or time that it takes for the known data packet to be sent from one particular user terminal to another and is, preferably, measured first; and the terminal computational power relates to how efficiently and effectively a particular terminal processes and prepares data or other information that it sends and receives and can be obtained by, for example, causing a common or test operation to be performed by each user terminal of the particular p2p network. The peer-to-peer server 108 controls sending of the predetermined test packet(s) by each of the user terminals 100 to each of the other user terminals 100, as part of determining the initial data that constitutes the data parameters table, which is associated with the particular p2p network being established. As the data parameters table indicates, data related to bandwidth, data related to latency and data related to terminal computational power might be determined utilizing such a known data packet, or other known amount of data, when such is sent by user terminal 100-1 to user terminal 100-2; when such is also sent by user terminal 100-1 to user terminal 100-*m*; and likewise when it is sent to user terminal 100-*n*. After all the desired data or other information is determined and stored or otherwise made available for analysis, the programming code or software, which is provided to each such user terminal 100, including the topology manager 100-*m*, is used by the topology manager 100-*m* to analyze such data and obtain results related to which of the user terminals 100-1, 100-2 . . . 100-*m*, 100-*n* should serve as the master terminal. In the illustrated embodiment, this was determined to be user terminal n 100-*n*. In an embodiment in which bandwidth, latency and computational power related data are utilized, the software is able to determine the identity of the master terminal by comparing results involving the terminals associated with such parameters, while giving each parameter a desired or appropriate weight relative to the other two parameters. In that regard, a "selected fitness value" can be determined that is the current best value, in comparison with other determined fitness values. There is a fitness value determined for all, or at least a number of all, possible topologies for a particular p2p network. The possible topologies for a certain number of user terminals (e.g. nine or less user terminals) are identified and preferably stored or devised for use in determining such possible fitness values. Each fitness value can be determined using one or more software implemented algorithms, formulas, equations, or metrics that use the data stored in the data parameters table, such as the bandwidth, latency and computational power data or measurements. In one embodiment, the fitness value that is the smallest or lowest of the calculated fitness values is the selected fitness value and that selected fitness value is associated with the determined topology, which includes the identity of the master terminal(s) that is included with that topology. In one embodiment as well, and referring to the bandwidth data, such data that is used in determining the selected fitness value is also a function of the number of audio and/or video channels for each of the particular user terminals. That is, the bandwidth measurements which are stored in the data parameters table have been normalized to take into account the number of such channels so that bandwidth data of user terminals that may have different numbers of audio and video channels is represented as if each user terminal has the same number of such channels.

It should be appreciated that fewer than all n parameters could be utilized in the analysis for determining that the master terminal is user terminal 100-n. For example, the computational power associated with each of the user terminals may be one of the n provided parameters but in some embodiments might not be used in ascertaining the master terminal Related to this, it should be appreciated that one or more data parameters might not be determined in arriving at the contents of the data parameters table. As another example, the data parameters table might comprise a single parameter, such as related to the bandwidth associated with the communication path for each pair of user terminals 100s that are part of the particular peer-to-peer network. Based on such bandwidth determinations, this stored information that makes up the data parameters table can be analyzed using the software included with the user terminal control 112 of the topology manger 100-m in order to determine that the user terminal 100-n should be the master terminal. It should be further appreciated that factors or parameters not presently used might be included in determining a selected fitness value in other embodiments, such as arriving at communication cost related data and incorporating that into the selected fitness value determination.

Subsequent to the steps for determining the topology for the particular p2p network including the master terminal indicated by block 212, the p2p network can be utilized or implemented (denoted by block 220), including sending/receiving video and/or audio from each of the user terminals 100 having the hardware and software combinations of the present invention. Generally, video and/or audio can be sent from the video and audio input devices of the respective user terminals 100 to the other of such user terminals 100 that are part of the particular p2p network. In accordance with the established peer-to-peer network of the embodiment of FIG. 1 where both video and audio can be communicated, the slave terminal 100-1 is able to send video and audio directly to the master terminal 100-n; the slave terminal 100-2 is able to send its video and audio directly to the master terminal 100-n; and the slave terminal 100-m is able to send its video and audio directly to the master terminal 100-n. As indicated by block 224 of FIG. 3, as part of sending such video and audio to the master terminal 100-n, the video/audio control 112 of each of the slave terminals 100-1, 100-2 . . . 100-m is involved with controlling such video and/or audio to the master terminal 100-n. The block 224 also relates to the control exercised by the master terminal 100-n in connection with analyzing and preparing video data and audio data to be sent to such slave terminals. In the case in which all slave terminals 100-1, 100-2 . . . 100-m are sending video and audio, the master terminal 100-n outputs or otherwise provides an aggregate or composite of video and audio that is to be received by other slave terminals. By way of example, regarding video and audio being sent to slave terminal 100-1, the master terminal 100-n provides an aggregate of video and audio associated with, or originating from, the slave terminal 100-2 and the slave terminal 100-m, as well as video and audio from the master 100-n itself, together with video and audio data from any other slave terminals that are part of this particular p2p network, except for slave terminal 100-1. Likewise, regarding video and audio being sent to slave terminal 100-2, the master terminal 100-n generates an aggregate of video and audio associated with, or originating from, the slave terminal 100-1 and the slave terminal 100-m, as well as video and audio from the master 100-n itself, together with any other slave terminals in the network, except slave terminal 100-2. Continuing with this example and referring to block 228, the aggregate data from the master terminal 100-n being sent to slave terminal 100-1 is received by its video/audio control 112, which outputs video out and audio out for subsequent outputting of video and audio, including voice, by the video display 124 and the speakers 128 of the slave terminal 100-1, whereby the player/user of the slave terminal 100-1 can see the video, such as the faces, received from the other players and hear the audio, such as voices, received from the other players.

Figure 5:
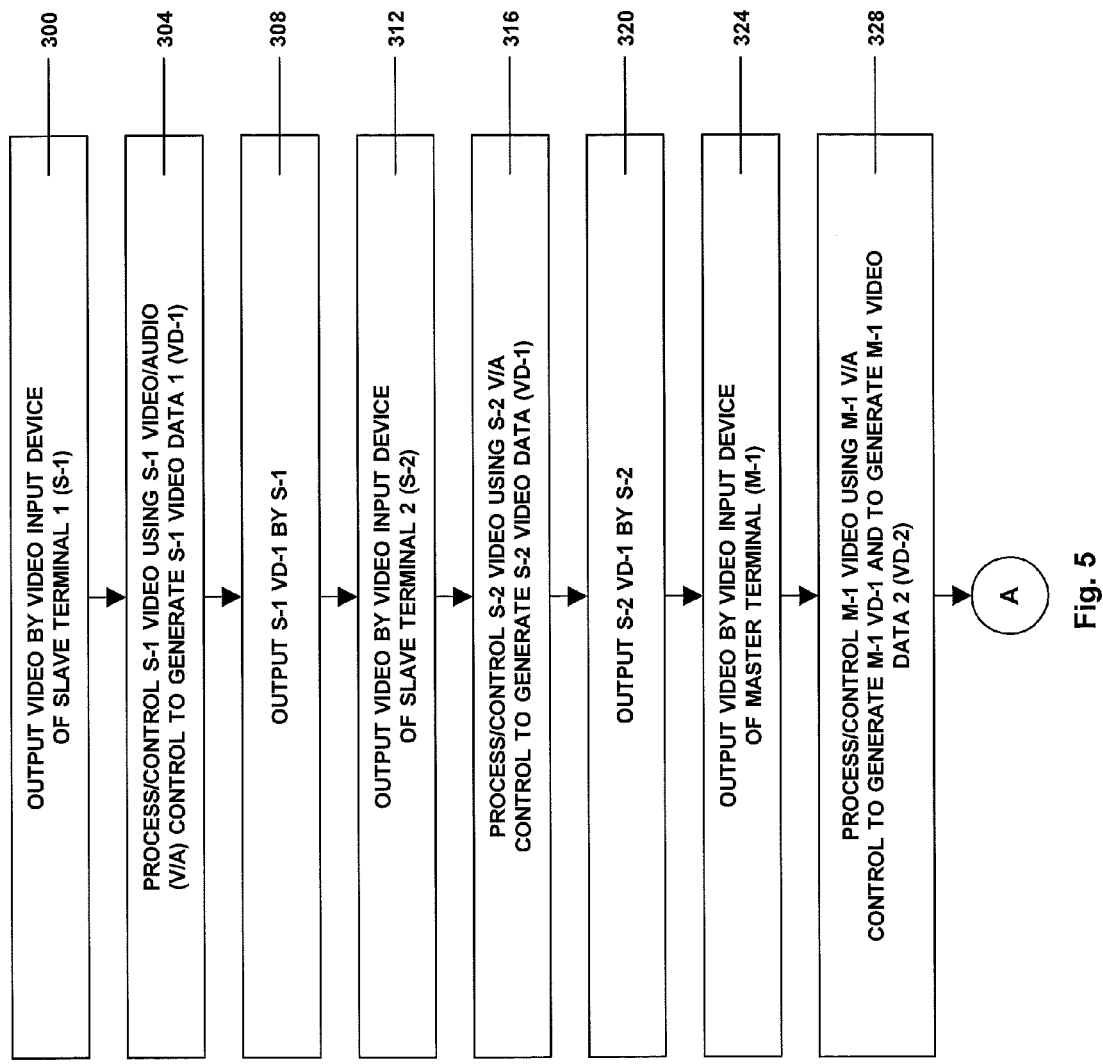
FIGS. 5-7 are flow diagrams related to video communications involving user terminals including the master terminal.
Figure 6:
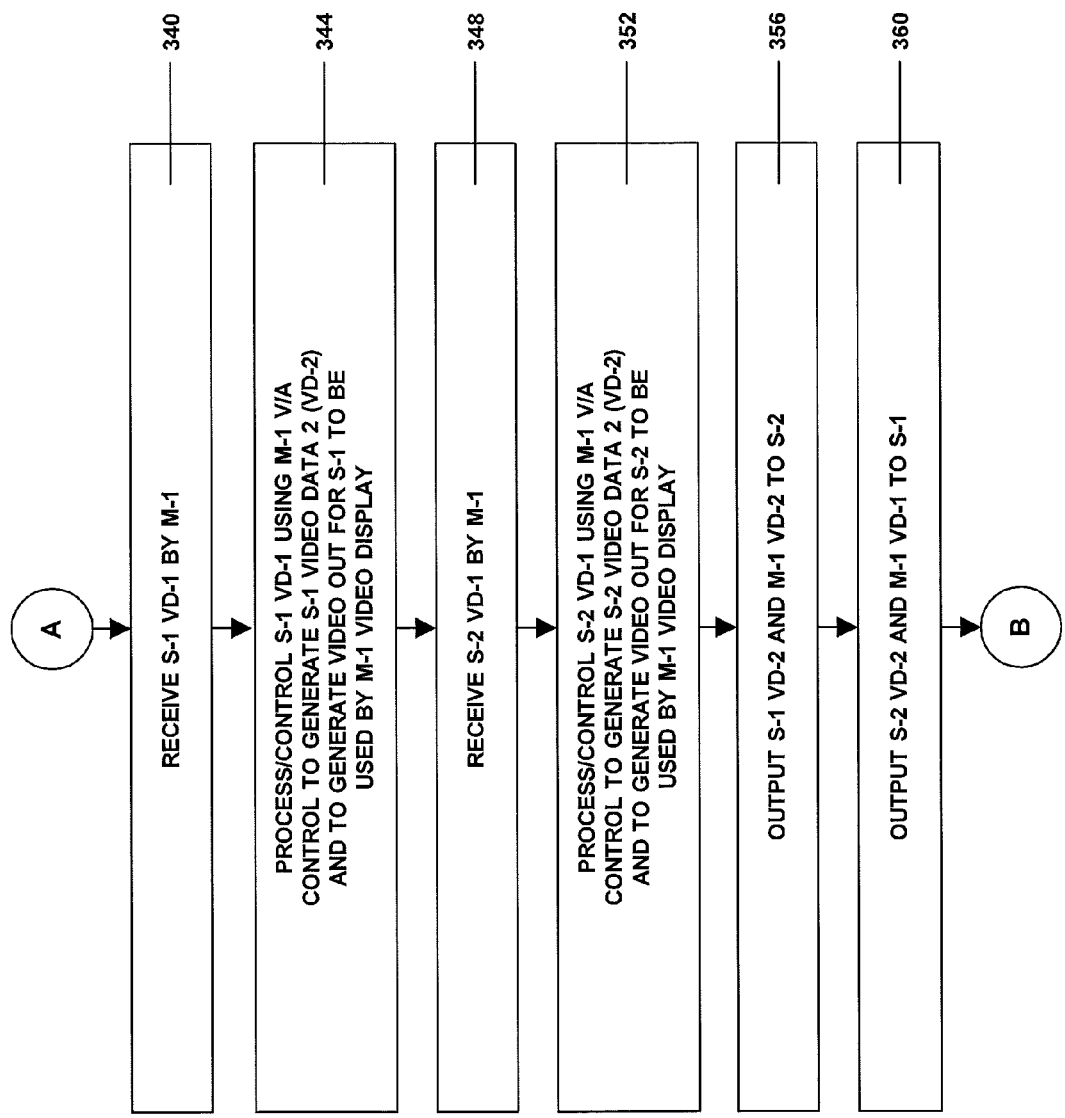
Figure 7:
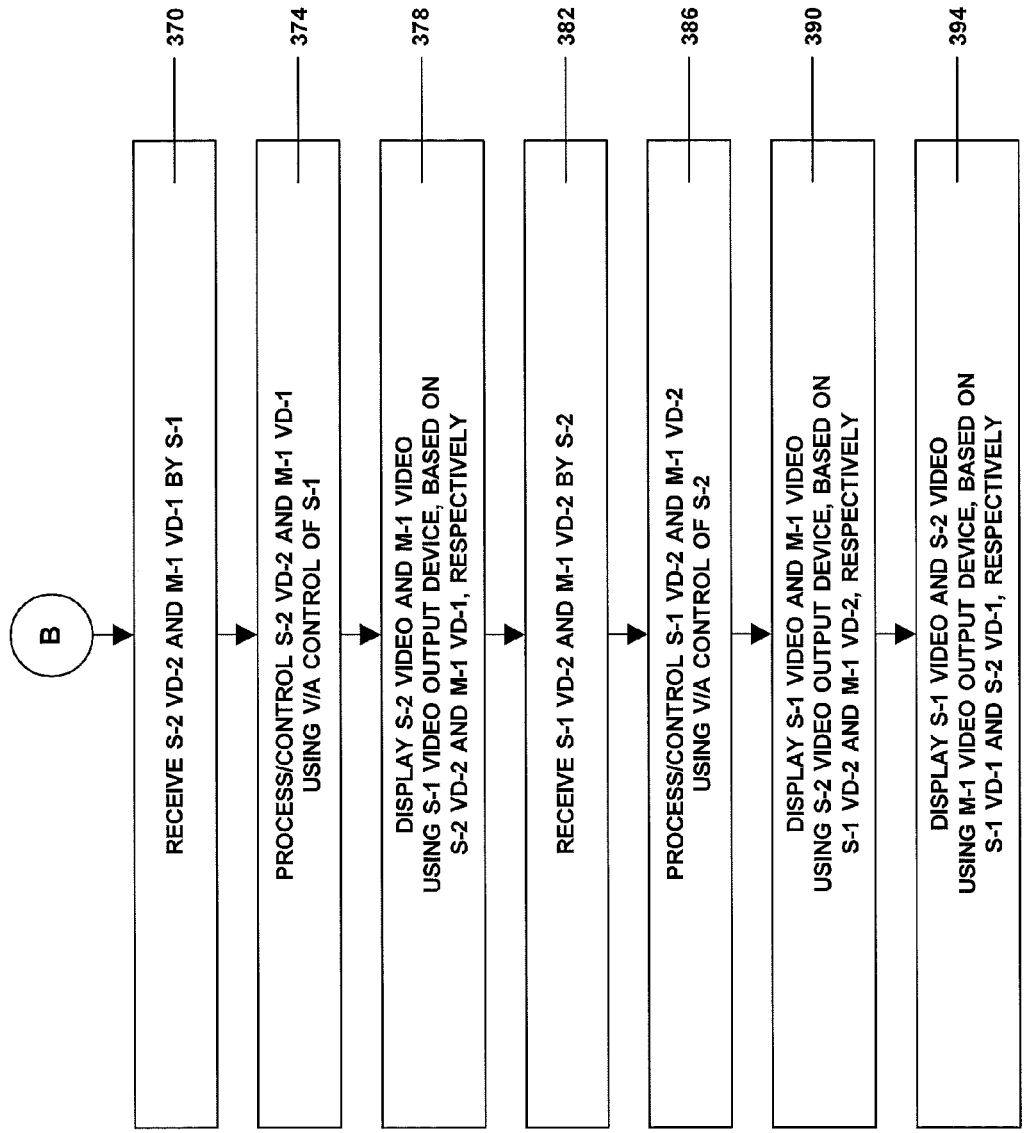

Referring next to FIGS. 5-7, greater detail is described concerning the sending/receiving and control of video, in accordance with the present invention. Such description is in the context of an example in which the p2p network includes at least the slave terminal 1 100-1, the slave terminal 2 100-2, and the master terminal n 100-n, although it should be understood that many other examples involving different numbers of user terminals are possible when using the present invention. Descriptions related to audio will be subsequently provided, although it should be understood that, when both video and audio are being transferred, it is preferred that they be sent together as part of aggregate packets or signals.

Referring to block 300 of FIG. 5, the video input device, such as the digital camera 116, of slave terminal 100-1 receives a video input, such as the face image of the player using slave terminal 100-1. This video is output by the digital camera 116 of the slave terminal 100-1 and sent to its Flash Player 144 using its operating system 140. That is, the video in associated with the video from this digital camera 116 is received by the Flash Player 144, where it is encoded under the control of the control module 148 of the slave terminal 100-1, as generally indicated by block 304. Such control usually includes compressing the video by a desired degree or determined amount, based on the control from the control module 148 so that the resulting compressed data is quantitatively less than the original video in data, but remains an accurate representation of all original video in data. Other or additional control related to compression of the video in input could be in the form of deleting or dropping portions of the video in, again based on a control input from the control module 148; however it is much preferred that such loss of video data not occur using slave terminals. Instead, control is exercised using the control module 148 of the slave terminal 100-1 such that video bit rates are chosen to avoid dropping or deleting of video data, while satisfying desired bandwidth and other transmission performance requirements associated with sending such data from the slave terminal 100-1 to other terminals. This contrasts with operations of the master terminal 100-n, which does control video by dropping video data portions, and which function is commonly utilizable by it and any other master terminal The software of the control module 148 that provides such control over the video in utilizes or takes into account the previously determined information that is found in the data parameters table of FIG. 4. Since the video data generated by the user terminal control of the slave terminal 100-1 is to be provided to the master terminal 100-n, such software relies on the information in the data parameters table involving transfers between slave terminal 100-1 and the master terminal 100-n. As previously noted, certain parameters are analyzed and determined related to communications capabilities including between the slave terminal 100-1 and the master terminal 100-n. For example, at least based on the bandwidth associated with data packet communications between the slave terminal 100-1 and the master terminal 100-n, the control module 148 of the slave terminal 100-1 makes a determination regarding the encoding of the video in, including any degree of video compression of video in that is received by it, pursuant to the supervision of the operating system 140.

With respect to such video encoding or other video processing in which certain video portions are dropped or deleted altogether using a master terminal, the processed video can be defined or characterized as being part of a "key frame" or an "inter-frame." A key frame is a complete image. An inter-frame has only the changes since the most recent key or inter-frame. A droppable inter-frame has only the changes since the most recent key or inter-frame. The difference between an inter-frame and droppable inter-frame is that nothing references a droppable inter-frame. In other words, if a droppable inter-frame were dropped, the next frame would either be a key frame, which is a complete image, or the next frame would contain all changes since the most recent key or inter-frame and if it were displayed all information for the current image would be updated. If an inter-frame were dropped, one would need to wait for the next key frame to be able to update the image. Each such droppable inter-frame can be deleted or dropped typically to save bandwidth while preserving desired video quality. Each droppable inter-frame is typically marked as part of the operation of the video encoder/decoder so that each such droppable inter-frame is known or designated After the video in is controllably encoded, the resulting video data that is generated is output by the control module 148 utilizing user datagram protocol (UDP), as indicated by block 308. Such video data is sent based on the communications capabilities previously determined between the slave terminal 1 100-1 and the master terminal n **100-*n***.

In continuing with the representative example that includes the second slave terminal 2 100-2 and referring to block 312, like that just described concerning the slave terminal 100-1, the video input device of the second slave terminal 100-2 provides video in, by means of its operating system 140, to its user terminal control 112. The video in of this slave terminal 100-2 is processed and/or controlled to generate the video data that it will output to the master terminal **100-*n*, according to block 316. Like the video associated with the slave terminal 100-1, such video data output by the slave terminal 100-2, is encoded depending on the communications capabilities involving the slave terminal 100-2 and the master terminal 100-*n*. Such dependence involves utilization of the information in the data parameters table related to known or test data transfers between the slave terminal 100-2 and the master terminal 100-*n*. Such parameters can be different from those associated with the slave terminal 100-1 and the master terminal n 100-*n*. For example, the bandwidth may be greater resulting in a different degree of compression based on the video in from the webcam 116 of the slave terminal 100-2. The generated video data from the user terminal control 112 of the slave terminal 100-2 is output to the master terminal 100-*n*, as denoted by block 320**.

Referring next to block 324, and continuing with the example, the master terminal **100-*n* video input device 116 outputs its video in, which is received by its user terminal control 112. As indicated by block 328, such video in of the master terminal 100-*n* is processed, or otherwise controlled, in order to generate video data-1 and also to generate video data-2. Video data-1 is subsequently sent to the slave terminal 100-1 and video data-2 is subsequently sent to the slave terminal 100-2. In connection with such processing, the control 112 of the master terminal 100-*n* relies on information in the data parameters table related to communications capabilities involving it and each of the slave terminals 100-1, 100-2 in order to generate the processed video data for sending to the slave terminals 100-1, 100-2, which processing or controlling steps are similar to those described in conjunction with block 224**.

In addition to handling the video in from its own video camera 116, the user terminal control 112 of the master terminal **100-*n* is also responsible for processing or controlling the video data-1 and the video data-1 that it receives from the slave terminal 100-1 and the slave terminal 100-2, respectively. More specifically, and referring to block 340 of FIG. 6, the master terminal 100-*n* receives the video data-1 provided by the slave terminal 100-1. As indicated by block 344, the master terminal 100-*n* control 112 processes and/or controls such video data to output or generate video data-2 associated with slave terminal 100-1. This video data-2 of the slave terminal 100-1 is to be provided to the slave terminal 100-2. Accordingly, the master terminal's control 112 relies on the communications capabilities between the master terminal 100-*n* and the slave terminal 100-2**, as reflected by the contents of the stored data parameters table, to provide processed or controlled video data that is acceptable to or compatible with such communications capabilities between these two user terminals.

With regard to possible video processing by the master terminal control 112, the slave terminal 100-1 video data-1 may have video portions that are dropped and not transferred, such as when the performance factors or characteristics associated with the communications path between the master terminal **100-*n* and the slave terminal 100-2 requires that less video data be sent. However, there is no further or different compression of such video data. That is, the video data-1 of the slave terminal 100-1 is not decompressed or decoded by the master terminal 100-*n* for subsequent different compression before sending such video, in the form of video data-2, to the slave terminal 100-2. As an alternative though, the master terminal's control 112 may simply control or pass the same video data that it receives from the slave terminal 100-1, in the form of video data-1, to the slave terminal 100-2. As another variation, instead of the master terminal's control 112 determining that video portions are to be dropped before sending the video data to the slave terminal 100-2, a different determination might be made. More specifically, the p2p network involving the controls 112 of one or more of the user terminals 100, including the control 112 of the slave terminal 100-1, could determine a less than optimum transfer, given the performance capabilities of the particular communication path, of such data from slave terminal 100-1. Rather than optimally, or substantially optimally, utilizing the communication path between the slave terminal 100-1 and the master terminal 100-*n*, a less than optimum or less than usual transfer might be determined so that video portions are not dropped or lost when video data from one slave terminal (e.g. slave terminal 100-1) is transferred by the master terminal to another slave terminal (e.g. slave terminal 100-2**), even though on a relative basis the performance capabilities (e.g., bandwidth, delay) associated with the communication path between the one slave terminal and the master terminal is higher or greater than those between the master terminal and the other slave terminal.

Likewise and as noted by block 348, the video data-1 of the slave terminal 100-2 is also received by the master terminal **100-*n* using its user terminal control 112. After receiving such video data and as indicated by block 352, it is processed and/or controlled to generate video data-2 associated with the slave terminal 100-2. Such control is usually accomplished based essentially on the communications or performance capabilities involving the master terminal 100**-*n* and the slave terminal 100-1, as found in the data parameters table of FIG. 4; however, other variants are possible including comparable to those discussed above related to video data transfers involving the slave terminal 100-2.

With respect to blocks 356 and 360, the video data from these three user terminals 100-1, 100-2 and 100-*n* are provided to certain other of the user terminals 100-1, 100-2, 100-*n*. In particular, both the video data-2 associated with the slave terminal 100-1 and the video data associated with the master terminal 100-*n* are output to the other user terminal 100 of this representative example, namely, the slave terminal 100-2. Similarly, the video data-2 associated with the slave terminal 100-2 and the video data-1 associated with the master terminal 100-*n* are output to the other slave terminal 100-1, preferably both outputs use an aggregate packet transfer in which frames defined as containing the packets preferably include video data obtained from more than one user terminal and, more preferably, when audio data is also being communicated the packets include aggregated audio data and video data.

Regarding such outputs and referring to FIG. 7, block 370 indicates that the slave terminal 100-2 video data-2 and the master terminal 100-*n* video data-1 are received by the slave terminal 100-1, namely its user terminal control, such as its video/audio control 112. Next at block 374, such video data is processed and/or otherwise controlled by this video/audio control of the slave terminal 100-1. Basically, each of the video data-2 from the slave terminal 100-2 and the video data-1 from the master terminal 100-*n* are decoded under control of the software of the video/audio control 112 of the slave terminal 100-1 in order to provide a video out associated with each of the received video data. Each video out is organized or managed using the operating system 140 of the slave terminal 100-1 for application to the video output device, such as the video display 124, of the slave terminal 100-1. Regarding block 378, the video display device 124 displays the video that had been provided by each of the video cameras 116 of the slave terminal 100-2 and the master terminal 100-*n*. The display of such video can occur simultaneously so that the user or player utilizing the slave terminal 100-1 can see the video, such as the user's face, originating from user terminals 100-2 and 100-*n*. In one embodiment, the first slave terminal 100-1 also has its video display 124 providing a display based on the input to its own camera 116, as well as displaying video originating from the master terminal 100-*n* and the slave terminal 100-2.

Like the slave terminal 100-1, as indicated by block 382, the slave terminal 100-2 receives video data provided by the slave terminal 100-1 and the master terminal 100-*n*. As noted by block 386, its user terminal control (e.g. video/audio control) 112 processes and controls such video data. More particularly, the video data-2 associated with the slave terminal 100-1 is decoded, either substantially at the same time or at different times, with the decoding of the video data-2 associated with the master terminal 100-*n*. As a result of such decoding, the resulting processed information or signals (video out) can be applied to the video display 124 of the slave terminal 100-2 (referring to block 390), whereby the video originating from each of the slave terminal 100-1 and the master terminal 100-*n* are seen using the video display 124 of the second slave terminal 100-2.

Additionally, in furtherance of this example involving two slave terminals 100-1, 100-2 and the single master terminal 100-*n*, block 394 indicates that the master terminal 100-*n* using its video output device, such as its video display 124, displays the video originating from each of the first and second slave terminals 100-1, 100-2, based on the video out information or signals that were obtained.

Figure 8:
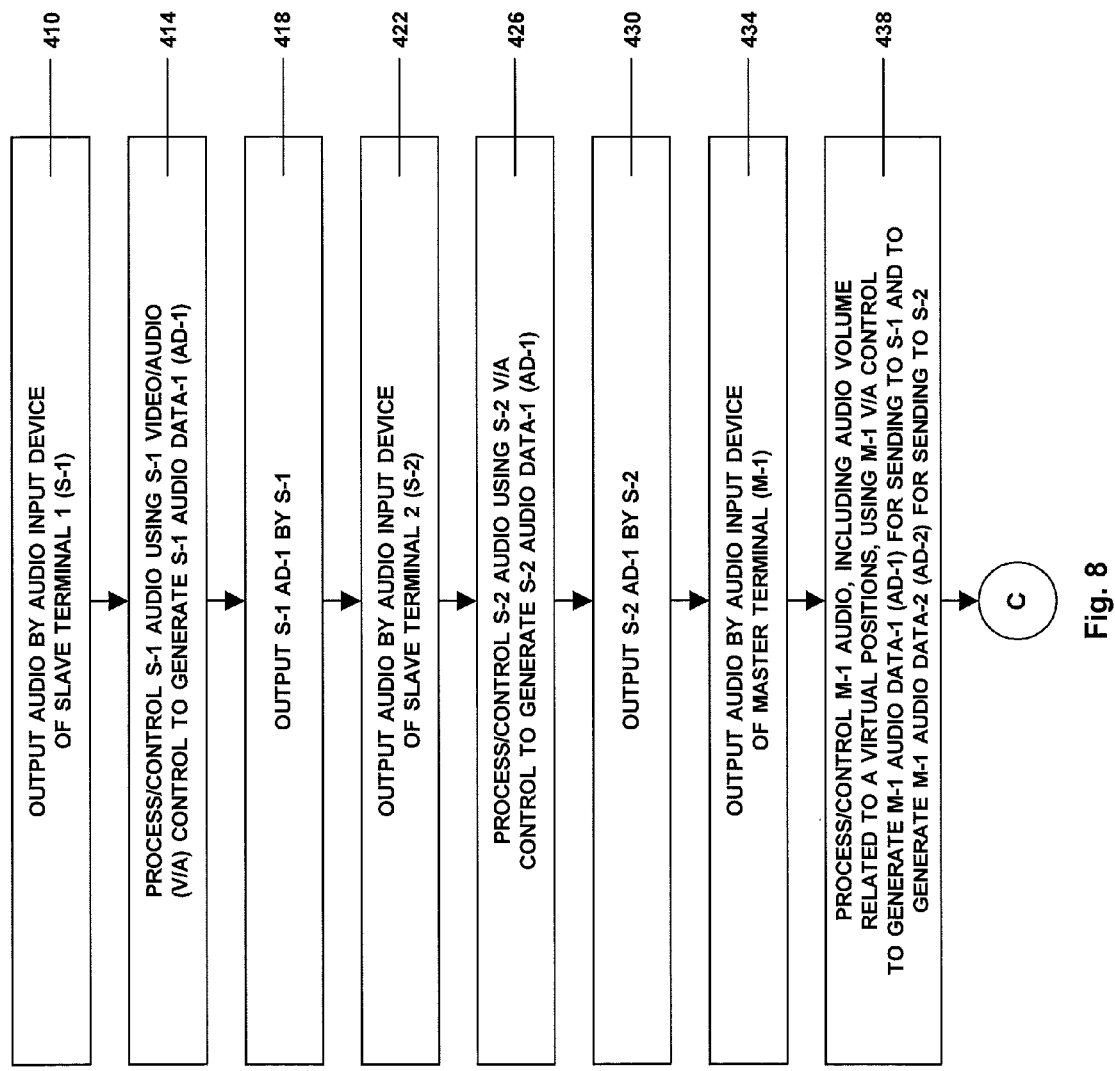
FIGS. 8-10 are flow diagrams related to audio communications involving user terminals including the master terminal.
Figure 9:
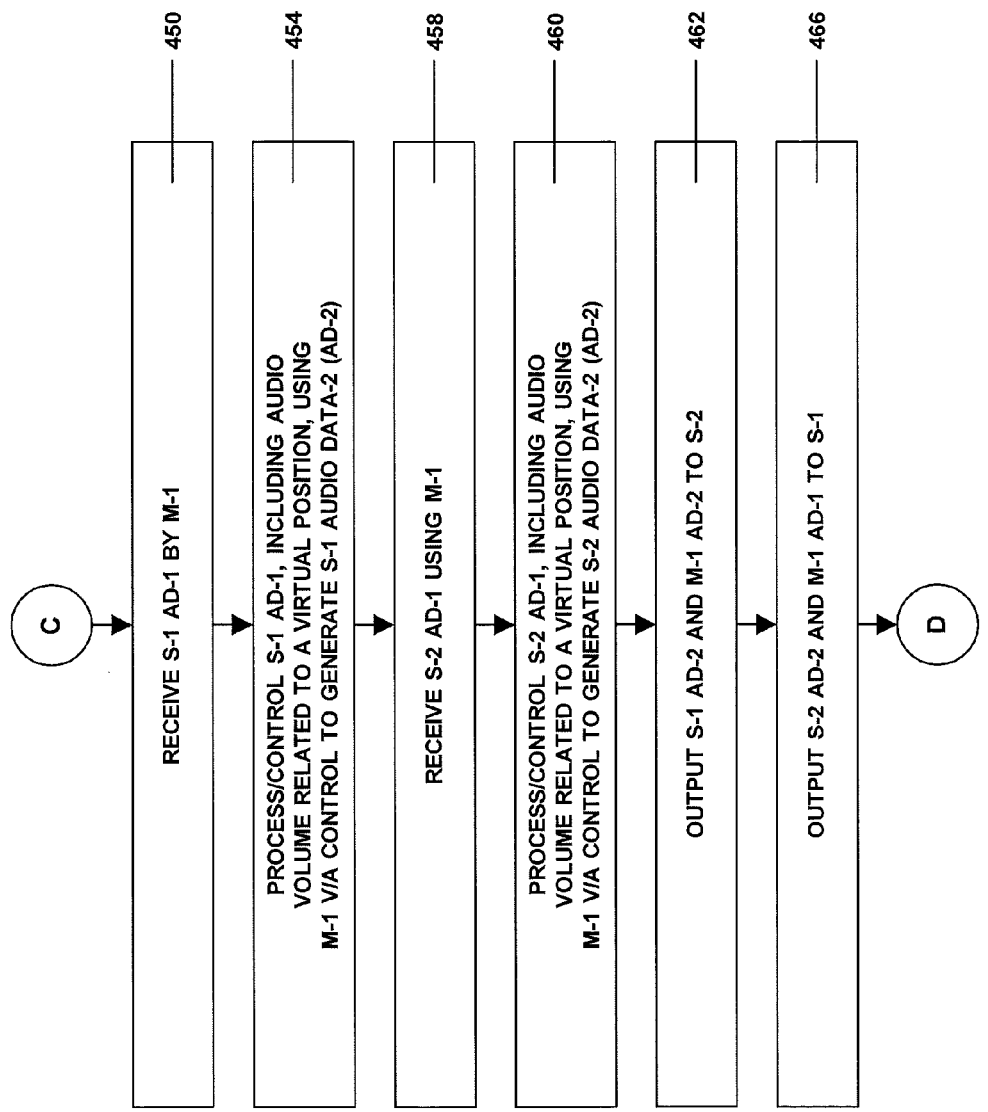
Figure 10:
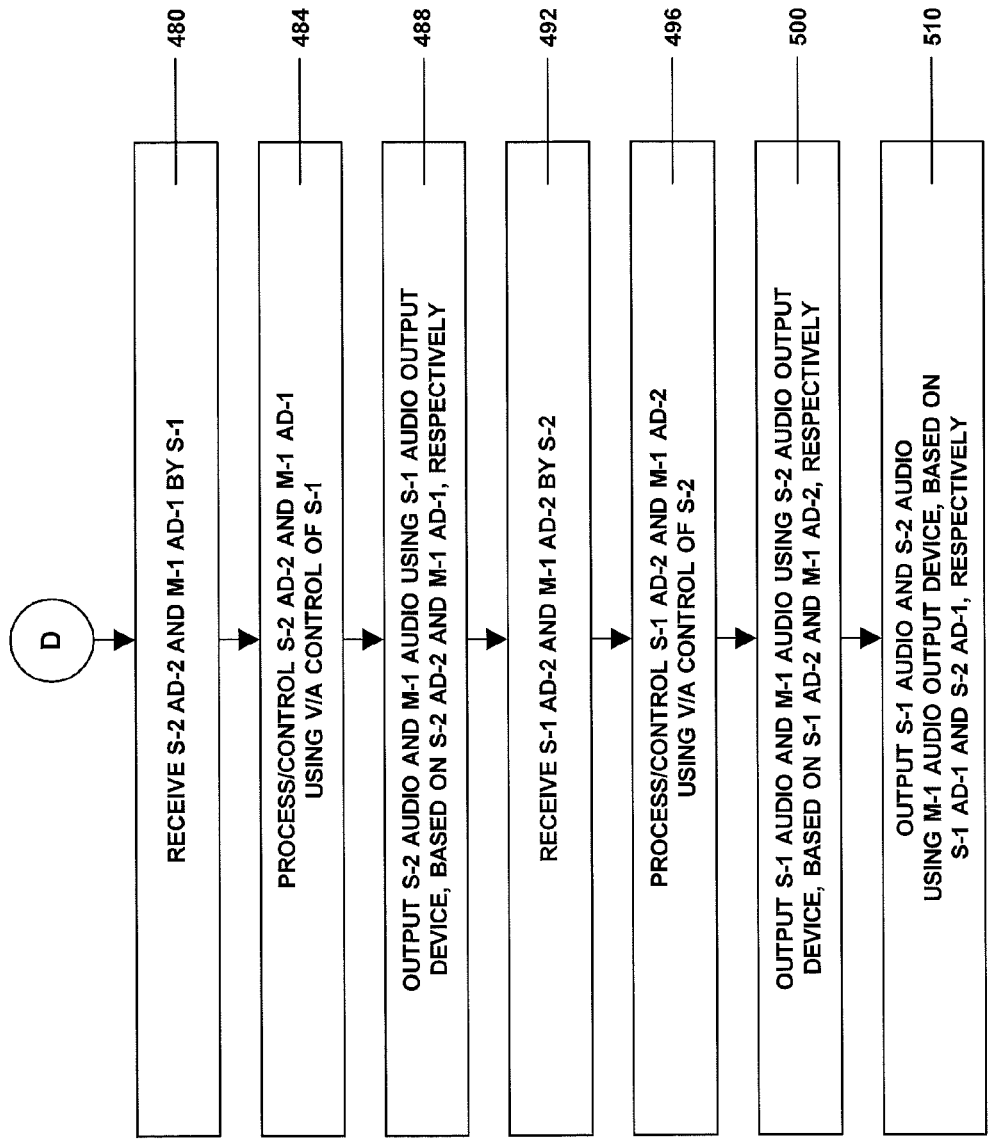

In addition to providing video communications, audio can also be communicated among the user terminals 100 that are part of the inventive peer-to-peer network. Fundamental steps involved in such communications are illustrated in the diagrams of FIGS. 8-10. Although the descriptions in such blocks refer to audio, audio and video can be generated and communicated at the same time. The descriptions concerning audio communications, like the diagrams of FIGS. 5-7 directed to video communications, are provided separately from video to simplify the discussion. The following audio-related descriptions are also in the context of the representative example in which the peer-to-peer network is established having one master terminal and at least two slave terminals 100-1, 100-2, although it should be appreciated that substantially more examples or embodiments are possible having different numbers of user terminals. Referring to block 410 of FIG. 8, especially as it relates to the user or player using the slave terminal 100-1 and speaking into its audio input device, such as the microphone 120, the audio output by the slave terminal 100-1 microphone 120 is processed by its user terminal or video/audio control 112, in accordance with block 414. The video/audio control 112 is used in encoding the audio for use in outputting it to the master terminal 100-*n*, either separately or with any video that is to be sent as well.

In the embodiment in which the slave terminal 100-1 includes the Flash Player 144 and the control module 148, such encoding is done using the control module 148 and not the Flash Player 144. The audio output by the microphone 120 is managed by the operating system 140 to provide the audio in that is to be encoded using the control module 148. With respect to such encoding, unlike the video, the encoding may involve some audio compression but preferably does not involve any dropping or deleting of any audio in, except for audio losses due to use of lossy audio encoders/decoders, so that adequate and desirable audio is transferred among the different user terminals 100. Loss of audio is avoided in order to maintain desired audio quality output from the audio output devices. Furthermore, the bandwidth required for audio is significantly less than that typically required by video data.

When audio and video are being sent from a particular user terminal 100 at the same time using frames continuously provided, each of which is typically comprised of a number of data-containing packets, the determinations related to filling the packets with audio and video data depend essentially on timely transfers of the audio data. That is, the packets are first filled with audio data that achieves the adequate quality criterion for each particular or predetermined time period. Then, remaining unfilled packets can be provided with processed video data that include video corresponding, or substantially corresponding, in time to the audio data in those same packets, or packets in the same frames, to be sent. In one embodiment, one or more frames of audio data-containing packets are sent from the subject user terminal every predetermined period of time, such as every 20 milliseconds, and corresponding or related video data that fills such packets or frames is also sent at that rate. In the representative example involving the slave terminal 100-1, audio data (as well as any packet filling video data) that is generated using its control module 148 is output for sending to the master terminal 100-*n*, as indicated by block 418.

Comparable steps are utilized in conjunction with the audio being provided by the slave terminal 100-2, as conveyed by the blocks 422, 426, 430. That is, audio in is obtained from the microphone 120 of the slave terminal 100-2 by the operating system 140 for processing using the control module 148 of the slave terminal 100-2. The audio in for this slave terminal 100-2 is encoded to facilitate communication with the master terminal 100-n. The software of the control module 148 is used in determining the level of encoding or compression of the audio in, which can depend on factors or parameters included in the data parameters table of FIG. 4. The encoded audio data, and possibly including its corresponding or aligned video data, is output from the slave terminal 100-2 using its control module 148 for transfer to the master terminal 100-n.

In accordance with blocks 434, 438, audio can also be provided by the master terminal 100-n. Audio that is output by the microphone 120 or other audio input device of the master terminal 100-n is sent to its control module 148 utilizing its operating system 140. This audio in is processed or controlled to generate encoded audio data including audio data-1 and audio data-2. The audio data-1 from the master terminal 100-n is to be sent to the slave terminal 100-1, while the audio data-2 is to be sent to the slave terminal 100-2. Audio data-2 can be different from audio data-1 because the audio in was encoded differently based on differences in communication capabilities. The communication capabilities, such as bandwidth and/or latency, involving the master terminal 100-n and the slave terminal 100-1 may be different than that available for communications between the master terminal 100-n and the slave terminal 100-2.

In addition or alternatively, the resulting encoded audio data-1 and encoded audio data-2 may be different, even though both rely on or utilize the same audio in, in order to possibly provide different audio volumes to the slave terminals 100-1, 100-2. Such different audio volumes are based on, or are associated with, the audio being provided by, or originating from, the master terminal 100-n microphone 120. Such audio volume difference depends on, or otherwise is a function of or relates to, a determined, simulated or virtual position associated with the user terminals 100 that are part of the peer-to-peer network. More specifically, such as when the player/users of the user terminals 100-1, 100-2, 100-n are part of a group playing a game, each of the players can be determined or be defined (using one or more means, such as software being executed using one or more of the user terminals) as having positions relative to each other, e.g., around a virtual game-playing table. By way of example, a first slave terminal 100-1 player may be determined to be at a virtual position to the left of the master terminal 100-n player, while the second slave terminal 100-2 player may have a determined simulated position directly across, or opposite, from the master terminal 100-n player. In order to simulate the voice or audio from the master terminal 100-n player, which is heard by the slave terminal players and based on their relative positions, the audio volumes are different. That is, it can be beneficial to provide left-right spatial audio control and front-back spatial audio control, as well as control of the audio volume from each player or user. With respect to the first slave terminal 100-1, audio associated with or originating from the master terminal 100-n is "heard" primarily from its player's "right channel"; whereas the second slave terminal 100-2 player "hears" such audio essentially equally "from both channels or in both ears" because of the direct across virtual position. To achieve this desired "hearing", the video/audio control 112 of the master terminal 100-n arranges or otherwise controls the audio in to develop encoded audio data that can be used by the first and second slave terminals 100-1, 100-2 to provide such desired audio outputs. In one embodiment, each of the audio output devices of the slave terminals 100-1, 100-2 includes first and second speakers, which for example are associated with right and left audio outputs, respectively. In the case of the first slave terminal 100-1 player, the audio volume is controlled such that the first slave terminal 100-1 player's "right audio output" receives a greater audio output (relatively louder) by means of controlling the output from the speaker more near or associated with this player's right audio output. Accordingly, the voice or audio heard by the first terminal 100-1 player simulates what such a player would hear when that player's position is essentially to the left of the master terminal 100-n player. Dissimilarly, because the second slave terminal 100-2 player is located across from the master terminal 100-n, its first and second speakers would output essentially the same audio volume to be heard by that player.

Other potential embodiments that may benefit from the directional-related audio control by which users receive audio information based on their positions relative to other users include possible military applications. Military battle field personnel utilizing such audio features can have the ability to determine positions of their comrades relative to their own positions, including in real time and relative to the direction one's head is facing. Based on audio inputs from their comrades, determinations can be made by each particular individual related to the positions of his or her comrades that might be located along a 360 degree path defined around that particular individual. Such ability can promote desired awareness and enhance safety of military personnel. With respect to the entertainment genre, another potential application involves team-play action or adventure software games. During play it may be advantageous to have information regarding positions of various team members. Utilizing the audio control associated with player positions, as described herein, team members can be made aware of their relative positions, thereby potentially enhancing their successes as a team during the playing of the game.

With reference now to FIG. 9 and as indicated by block 450, the audio data-1 of the slave terminal 100-1 is received by the master terminal 100-n for processing by using its video/audio control 112, as noted by block 454. Such processing results in the generation of the slave terminal 100-1 audio data-2, which is to be provided to the slave terminal 100-2. Such processing includes any desired encoding of the audio data for its transfer from the master terminal 100-n to the slave terminal 100-2, which processing can be based on the bandwidth and/or latency attributes or other communication factors involving these two user terminals 100 and/or such analysis and processing can be related to providing desired audio outputs that depend on virtual positions of users or players. Basically, similar processing and/or analyses are conducted as was done during the steps associated with block 414, except that such controls are determined in the context of such audio data being sent to the slave terminal 100-2 by the master terminal 100-n and to be heard by the player utilizing that terminal.

Comparable steps are conducted related to the audio data-1 associated with or originating from the slave terminal 100-2. At block 458, the master terminal 100-n receives such audio data. Then, this audio data is processed and/or controlled, as indicated by block 460, using the video/audio control 112 of the master terminal 100-n to generate the slave terminal 100-2 audio data-2. Again, the objective is to encode, or otherwise provide, such audio data-2 so that is compatible with or acceptable for transfer via the communication path between the master terminal 100-n and the slave terminal 100-1, and/or has been properly prepared for desired audio volume output, which takes into account player virtual positions. Such encoding can include making determinations utilizing the data parameters table of FIG. 4, particularly when both video and audio are being sent as part of continuous frames of packets to the slave terminal 100-1.

Referring now to blocks 462, 466, outputting of the audio data processed by the master terminal 100-n occurs. That is, the audio data-2 of the first slave terminal 100-1, together with audio data-2 of the master terminal 100-n, are sent, preferably aggregated so that they are transferred at essentially the same time, to the second slave terminal 100-2 for use by that terminal. Similarly, the audio data-2 of the slave terminal 100-2 and the audio data-1 of the master terminal 100-n are preferably aggregated for sending to the first slave terminal 100-1 as noted by block 466, for use by that terminal. As previously described such audio data transfers are typically accompanied by simultaneous transfers of corresponding video data that corresponds with, or properly relates to, such audio data, if or when the particular embodiment involves video data communications.

Continuing with this example involving the audio data being output by the master terminal 100-n, reference is made to FIG. 10 and block 480. With respect to the audio data received by the first slave terminal 100-1, the user terminal, or video/audio, control 112 of the first slave terminal 100-1 receives the audio data-2 associated with the second slave terminal 100-2 and receives the audio data-1 associated with the master terminal 100-n. This user terminal control 112 is responsible for any decoding of such received audio data, as part of the steps associated with the block 484. That is, the control module 148 of the first slave terminal 100-1 prepares the received audio data to provide an acceptable audio out for input to the audio output device of this user terminal 100-1, including any voice inputs provided by the user/players of the user terminals 100-2, 100-n. As part of this generation of the audio out, the audio data-2 of the second slave terminal 100-2 and the audio data-1 of the master terminal 100-n are decoded, or otherwise prepared, so that the determined/desired audio volumes are achieved, which may reflect virtual or simulated positions of these two user terminals 100-2, 100-n relative to the first slave terminal 100-1. Specifically, based on the previously designated or determined virtual positions, the audio volume outputs by the two speakers 128 of the first slave terminal 100-1, and received from the second slave terminal 100-2, will be provided based on the player utilizing the user terminal 100-2 being to the left of the player utilizing the first slave terminal 100-1. The audio volumes associated with the two speakers 128 of the first slave terminal 100-1 will be different from each other, depending on this virtual or simulated relative position. Similarly, the audio volumes provided using the audio data from the master terminal 100-n are based on the player utilizing the master terminal 100-n being directly across from the player utilizing the second slave terminal 100-2. According to this example then, the audio volume output by the two speakers 128 would be essentially the same, whereby the second slave terminal 100-2 player preferably or ideally hears the audio as if the master terminal 100-n player were directly across from him or her. These steps and outcomes are summarized by block 488.

Continuing with FIG. 10 and steps related to audio data being provided to the second slave terminal 100-2 from the master terminal 100-n, block 492 indicates that the audio data-2 of the first slave terminal 100-1 and the audio data-2 of the master terminal 100-n are received by the user terminal, or video/audio, control 112 of the second slave terminal 100-2. Block 496 indicates actions or steps that are taken related to decoding or otherwise preparing such audio data to be output by the audio output device, e.g., the two speakers 128 of the second slave terminal 100-2. Such processing and/or controlling of this audio data can include providing audio volume outputs, according to block 500, that result in voices being presented, which are based on virtual or simulated positions of the players who are using the first slave terminal 100-1 and the master terminal 100-n relative to the second slave terminal 100-2 and its player.

Completing the description of FIG. 10 and regarding block 510, the master terminal 100-n also can output audio using its audio output device, such as its two speakers 128. That is, the master terminal 100-n, as noted in the description of FIG. 9, received audio data-1 of the first slave terminal 100-1 and audio data-1 of the second slave terminal 100-2. Such audio data was obtained as part of the processing/controlling indicated by blocks 414, 426 of FIG. 8. Like audio or voice that is output by the speakers 128 of the first and second slave terminals 100-1, 100-2, the speakers 128 of the master terminal 100-n output voice based on the virtual positions of these two slave terminals relative to the master terminal 100-n player.

Figure 11:
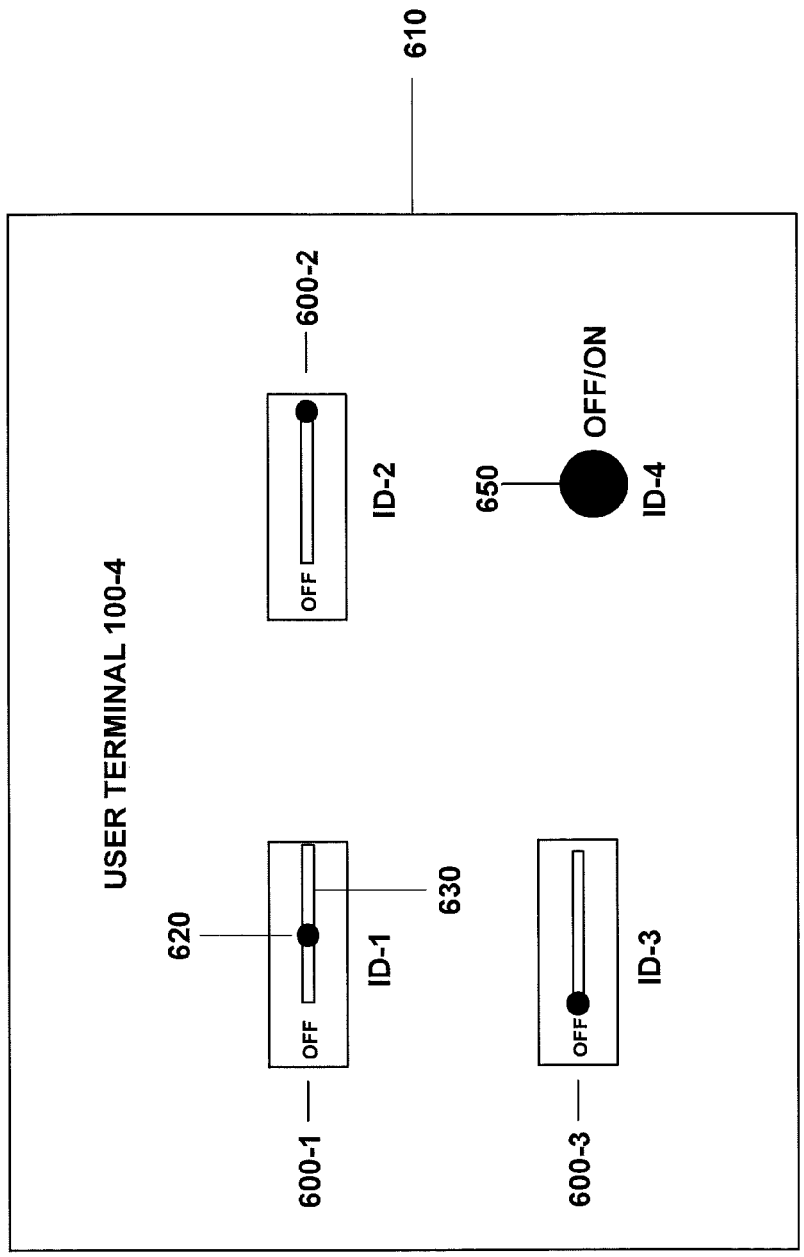
FIG. 11 is a block diagram illustrating an embodiment related to separately controlling audio volume associated with user terminals for possible output by a user terminal's audio output device.
Figure 12:
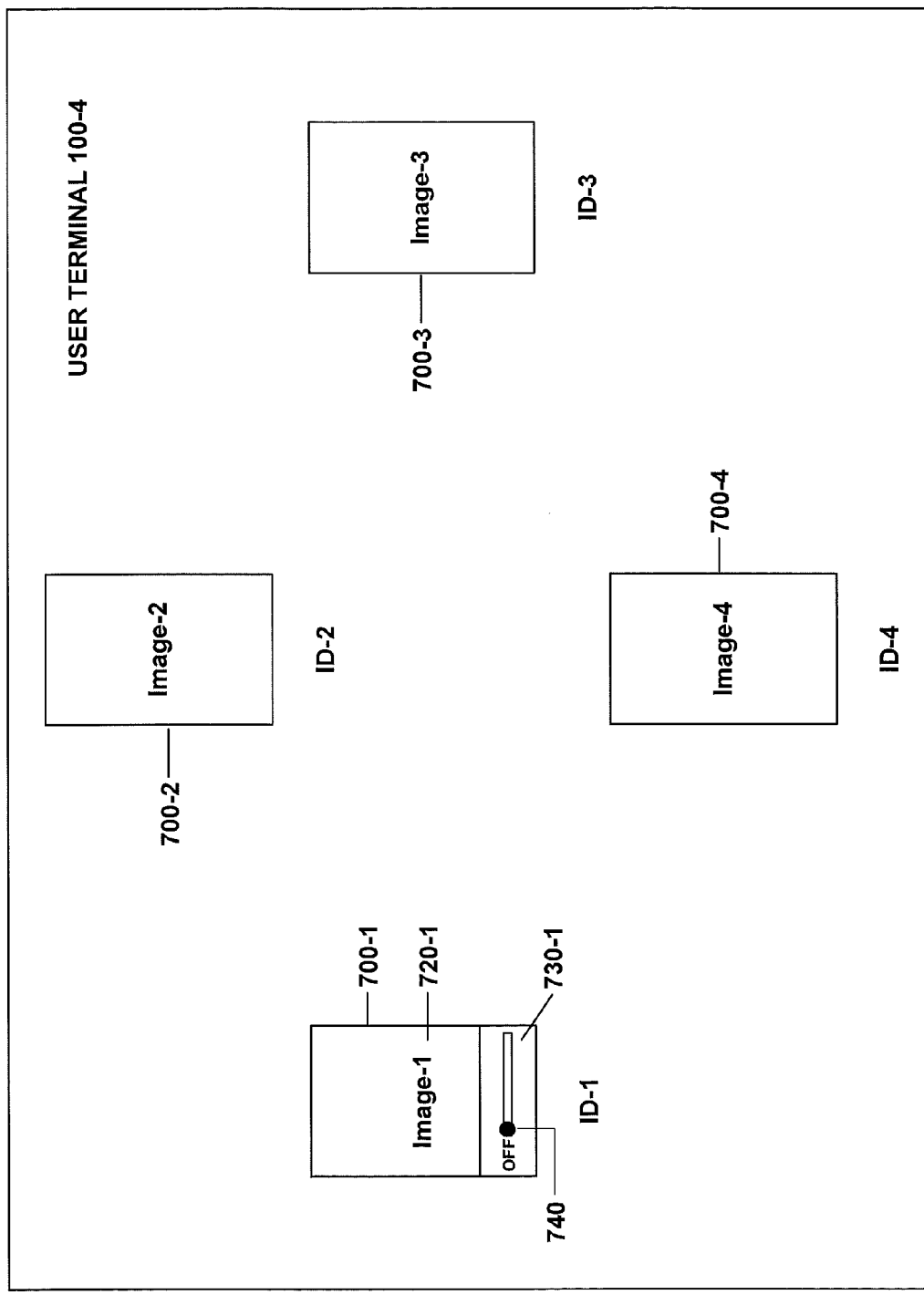
FIG. 12 is a block diagram illustrating another embodiment related to separately controlling audio volumes, as well video images, that can be provided to a user terminal's audio output device and its video output device.

Referring to FIGS. 11 and 12, these two figures diagrammatically illustrate another audio volume aspect in which each audio volume, associated with or from each user terminal and for providing to another or recipient user terminal, can be separately or independently controlled using devices provided with each user terminal's display screen or monitor. As conveyed using FIG. 11 in which the particular example of a communication system includes four user terminals 100, there is an audio volume control or device 600-1, 600-2, 600-3 provided for controlling, by user terminal 100-4, the level of each audio volume associated with each of the other three user terminals (100-1, 100-2, 100-3). Such control relates to regulating the composite audio volume that can be output by the audio output device of the user terminal 100-4, in which the composite audio volume includes, in this example, the audio volumes associated with the other three user terminals 100-1, 100-2, 100-3 and in which one or more such audio volumes can essentially be at a zero level. Each of the audio volume controls 600-1, 600-2, 600-3 is typically displayed, or otherwise provided, on a user terminal display screen 610. Each can be individually controlled by the user of the particular user terminal 100 having such audio volume controls 600 using any desirable means, such as a keyboard, a mouse, a movable cursor, or by touch screen activation. According to this embodiment, each audio volume control 600 includes a unit having a slider element 620 that is controllably positioned at a location along the length of a slit 630. The level or magnitude of the audio volume varies depending on the location of the slider element 620 relative to its slit 630, with the level increasing in desired degrees or amounts as the slider element 620 is positioned in a direction away from the end at which the audio volume is turned off, or essentially turned off. As shown in FIG. 11, this direction is a left-to-right direction. By way of the example of FIG. 11, the user of the user terminal 100-4 has controlled the audio volume of, or associated with, user terminal 100-1 so that such audio volume of user terminal 100-1 for providing to the audio output device of user terminal 100-4 is essentially halfway between turned off and fully turned on. Likewise, the audio volume of user terminal 100-2 is being controlled using the volume control 600-2 such that the audio volume of user terminal 100-2 is being provided at its highest available level. Based on the setting of the audio volume control 600-3 shown in FIG. 11 with the audio volume associated with user terminal 100-3 being turned off, no audio volume (essentially silence) is being provided using this user terminal 100-3 to the audio output device of user terminal 100-4. Consequently, the audio output device of the user terminal 100-4 essentially outputs audio or voice, when present, associated with user terminal's 100-1 and 100-2, and does not output audio or voice associated with user terminal 100-3, even though such audio or voice may be present from, or being provided using, the user terminal 100-3. With regard to controlling audio, in this example, associated with user terminal 100-3, it is preferred that any such audio not be provided to the audio output device of the user terminal 100-4. That is, the user terminal 100-3 previously received notice that the user terminal 100-4 does not want to output any audio or voice associated with the user terminal 100-3. Based on such notice or information, no audio or voice associated with the user terminal 100-3 is provided to the user terminal 100-4 for output by the audio output device of the user terminal 100-4. Such notice to one or more other user terminals can be provided using regularly sent data packets that can also include audio data or, alternatively, the notice can be provided in a different or special packet for that notice purpose. In another embodiment, audio or voice associated with the user terminal 100-3 is actually provided to the user terminal 100-4 but such audio/voice is controlled using the user terminal 100-4 such that this audio or voice is not output by its audio output device. Additionally in this embodiment or example, any audio or voice associated with or originating from the user terminal 100-4 itself is also not provided to this user terminal's audio output device. However, in the FIG. 11 embodiment, an audio off/on device 650 is included that allows the user/player of the user terminal 100-4 to turn off or turn on her/his own audio or voice that might be available for sending to the other user terminals 100-1, 100-2, 100-3. That is, whether or not the user of the user terminal 100-4 is sending the user's own audio to the other user terminals depends on the position or state of the audio off/on device 650. If the off/on device 650 is in the off state, the user's audio is not being sent to the other user terminals.

With respect to FIG. 12, this embodiment has utility in connection with playing a game that also has video communications capability. Similar to the example or embodiment of FIG. 11, certain control devices 700 are displayed using the video screen or monitor 710 of each user terminal 100. As with the FIG. 11 example, this embodiment also has a communication system comprising four user terminals 100-1 . . . 100-4. User terminals 100-4 is able to display control devices 700-1, 700-2, 700-3 associated with the other of the user terminals, in addition to a control device 700-4 associated with its own video (but not its own audio). The four user terminals 100, including the diagrammatically illustrated user terminal 100-4, comprise the particular communication system. FIG. 12 shows such control devices 700 for use by the user terminal 100-4. In this embodiment, each of the control devices 700 includes a predetermined section 720. Each predetermined section 720 is capable of displaying an image provided by each of such user terminals 100-1 . . . 100-4. The image can be a user's face, an avatar or any other image that might be useful in identifying the user of the user terminal from which the image is provided. Unlike the FIG. 11 embodiment, the audio volume control 730 associated with each such user terminal 100 is hidden, except that the user terminal 100-4 has no audio volume control of its own audio volume to its own audio output device. To display one or more of the three available audio volume controls 730, a predetermined action or step is taken, such as using a keyboard command, mouse movement, cursor location, or screen touch. Regardless of the required step(s), once completed, the audio volume control 730 is displayed, such as the audio volume control 730-1. After it is no longer hidden, like the FIG. 11 embodiment, the slider 740 of the audio volume control 730-1 can be desirably positioned, along a range from the audio volume being turned off to a fully turned on audio volume. When unhidden, the audio volume control 730-1 is displayed in a part of the section 720-1, such as a lower part thereof, which was previously occupied by portions of any image that were present. Although FIG. 12 shows only the audio volume control 730-1 associated with the user terminal 100-1 as being unhidden, it should be appreciated that the user of the user terminal 100-4 is able to cause one or more of the other audio volume controls 730 associated with the user terminals 100-2, 100-3 to be displayed as well and thereby be able to take the steps to control such audio volumes in the context of controlling which audio volumes associated with which user terminals 100 will be output by the audio output device of the user terminal 100-4. Controlling display of each image can also be provided. For example, the user of the user terminal 100-4 may not want to display the image from the user terminal 100-1. Utilizing one or more predetermined steps, such as selecting or activating a predetermined portion of the section 720-1, the display of Image-1 provided by the user terminal 100-1 to the user terminal 100-4 can be turned off. Dissimilar to the user's own audio, in one embodiment, Image-4 of the user terminal 100-4 can be displayed using the user terminal 100-4 utilizing its display control device 700-4, in addition to using a part of the display control device to control whether or not Image-4 can be sent to the other user terminals 100-1, 100-2, 100-3.

In an alternative embodiment, a user's selected image for display may not be displayable on that user's terminal.

From the above descriptions regarding audio communications, it should be understood that use of one or more master terminals, such as master terminal 100-*n*, in a p2p system results in desirable bandwidth savings due to the master terminal 100-*n* acting like a central controller for audio that is transmitted among numerous slave terminals. Instead of such audio information being communicated directly between each of the slave terminals, thereby requiring additional bandwidth to achieve such direct communications, the master terminal receives, processes and combines audio for sending to the slave terminals. Accordingly, such an aggregated signal to be sent to a particular slave terminal, with audio from more than one terminal (master and/or slave terminals audio), requires less bandwidth than the bandwidth required to send that same audio directly between slave terminals. Additionally, when possible and desired, the master terminal 100-*n* can synthesize more audio information using audio that it processes. For example, when sending aggregated audio to a particular slave terminal that has quadraphonic sound capability, the audio output by the master terminal 100-*n* to that slave terminal might include audio information compatible with the quadraphonic speakers of that particular slave terminal.

It should be further noted that the present invention does not require that every player or user involved in a particular group interaction, such as playing a game, have a user terminal that provides video and/or audio communications.

Accordingly, one or more players not having such audio and/or video communications capabilities can play the game with players who utilize user terminals that do have such capabilities. More specifically, one or more players may not have a microphone 120 and/or camera 116. Each player that does not have a camera 116 and a microphone 120 can receive video because the player has a video display 124 and can receive audio because the player has one or more speakers 128. In such a case, the player is able to receive video and voice but cannot send his/her own video and voice. Related to that case, the option remains available to prevent or otherwise control the sending of video and/or voice to such a player, i.e., reception of video and/or voice to that player could be turned off for one or more suitable reasons, such as resulting from some rules-based or policing system.

In addition to voice being controlled using the control module 148, game audio data is also input to the control module 148 from the Flash Player 144 so that the control module 148 can be involved in regulating audio that might be output by the speaker(s) 128 and picked up the microphone 120. The control module 148 includes an echo canceller component so that any remote player's speech will be removed from the sound picked up by the player's microphone 120 and thus not returned as an echo to the remote user. Similarly, because the game data sounds are also received by the echo canceller of the control module 148, those game sounds will be removed as well from the audio picked up the player's microphone 120. Consequently, players will not hear other players' game sounds.

Figure 13:
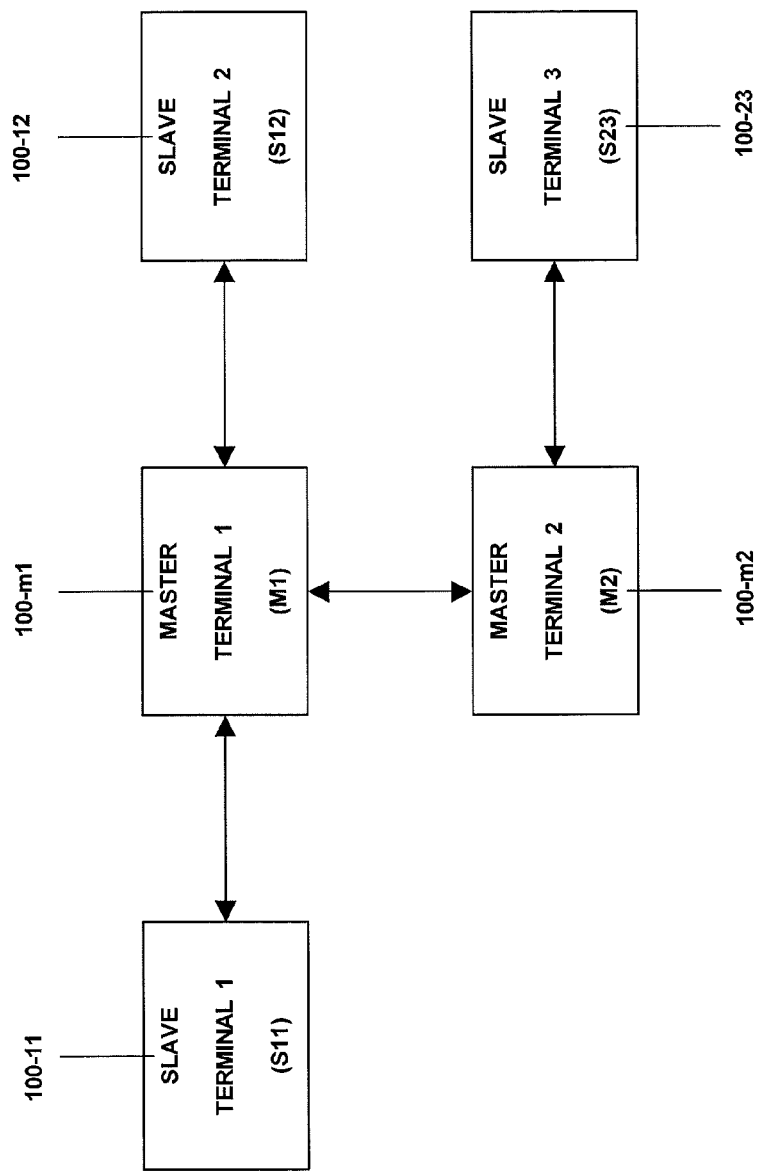
FIG. 13 is a block diagram that illustrates another embodiment of a peer-to-peer system of the present invention that includes more than one master terminal.

With reference to FIG. 13, a related but different embodiment of the present invention is illustrated. According to this embodiment, instead of a single master terminal, more than one master terminal can be utilized in connection with forming a peer-to-peer system and for providing video and/or audio communications among its user terminals 100. In this embodiment and representative example, the peer-to-peer system has five user terminals 100 although more or less user terminals are contemplated by this embodiment. Like the embodiment of FIG. 1, a topology manager is designated that is responsible for determining which of the user terminals 100 is to be a master terminal. Such determinations are made as previously described related to the embodiment of FIG. 1. With respect to the FIG. 13 embodiment, such determinations that were made involving the five user terminals 100 resulted in the identification of first and second master terminals 100-$m1$, 100-$m2$, together with slave terminals 100-11, 100-12 and 100-23. As also illustrated by FIG. 13, first and second slave terminals 100-11, 100-12 would communicate directly with or be directly associated with the master terminal 100-$m1$. Similarly, the third slave terminal 100-23 communicates directly, or is associated with the second master terminal 100-$m2$. In particular, the video and/or audio communications involving the first slave terminal 100-11 and second slave terminal 100-12 are input to or output from the first master terminal 100-$m1$ in order to communicate with the second master terminal 100-$m2$ and/or the third slave terminal 100-23. Similarly, video and/or audio inputs and outputs relative to the third slave terminal 100-23 are the responsibility of the second master terminal 100-$m2$. Consequently, such communications are processed and/or controlled by the first and second master terminals 100-$m1$, 100-$m2$ before being provided to the first slave terminal 100-11 and/or the second slave terminal 100-12. Likewise, video and/or audio communications originating from the first master terminal 100-$m1$ that are to be sent to the third slave terminal 100-23 are communicated first to the second master terminal 100-$m2$. And, video and/or audio communications originating with the second master terminal 100-$m2$ that are to be provided to the first slave terminal 100-11 and/or the second slave terminal 100-12 are controlled/processed initially by the first master terminal 100-$m1$. The determinations related to utilizing more than one master terminal are conducted using the software provided with the designated topology manager. Such software is provided to each of the user terminals 100, but is executed using the control of the user terminal 100 that was designated as the topology manager. As previously described in connection with FIG. 4, information or data is obtained, which is based on predetermined communications involving the five user terminals of this particular embodiment. The data can be arranged or otherwise provided in the data parameters table for subsequent analysis in determining that, for this particular embodiment, there are to be two master terminals 100-$m1$, 100-$m2$ and three slave terminals 100-11, 100-12, and 100-23, based on the determined topology for this particular p2p system. Additionally as part of this network topology, such software determines that the first and second slave terminals 100-11, 100-12 are associated with the first master terminal 100-$m1$, while the third slave terminal 100-23 is associated with the second master terminal 100-$m2$. The determinations resulting in the identification of first and second master terminals 100-$m1$, 100-$m2$ may depend, by way of example only, on a factor such as the third slave terminal 100-23 being geographically located at a great distance from the first and second slave terminals 100-11, 100-12 and the first master terminal 100-$m1$ so that communications are more effectively and/or more efficiently provided by utilizing the second master terminal 100-$m2$. In another variant, the determinations related to the master terminals 100-$m1$, 100-$m2$ may be based or depend on the fact that one or both them are part of an intra-network, in which a number of such user terminals share certain hardware and/or communication connections.

Figure 14:
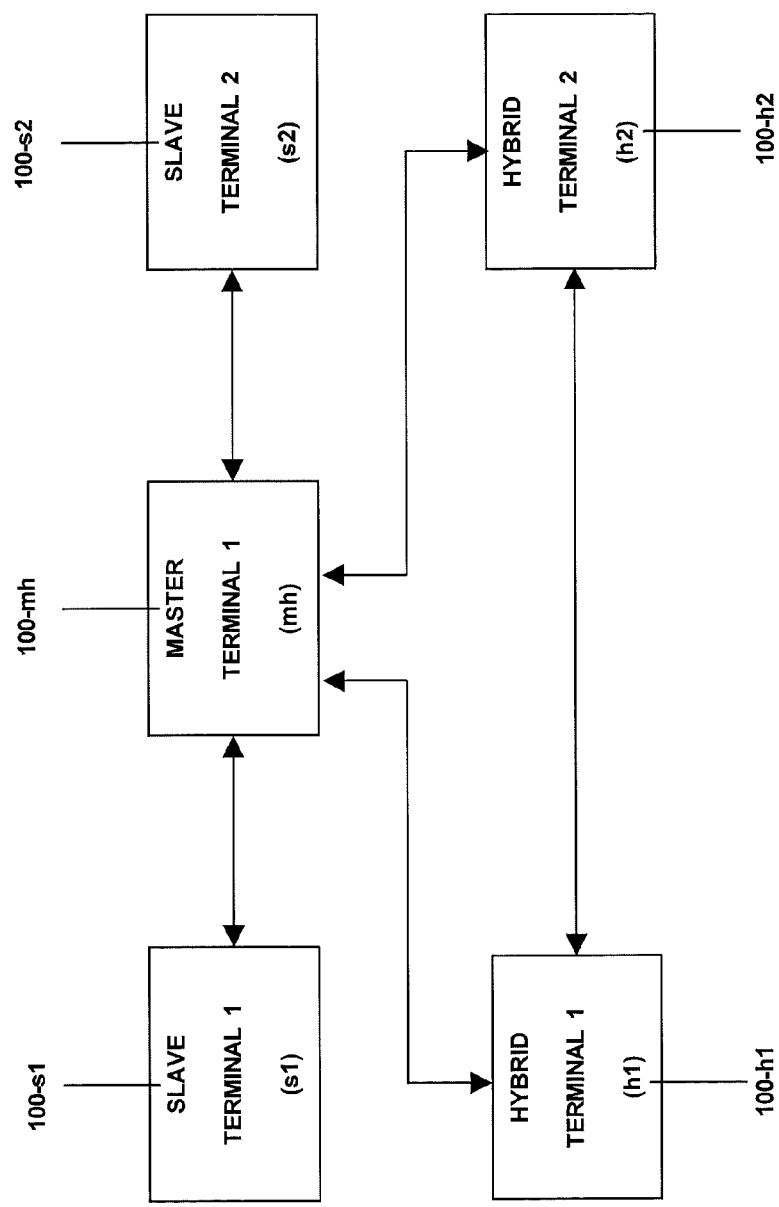
FIG. 14 is a block diagram of still another embodiment of a peer-to-peer system of the present invention that includes hybrid user terminals that communicate directly with each other, as well communicating with at least one master terminal.

Referring to FIG. 14, another embodiment is described which includes features of the other embodiments but differs in one main aspect involving video and/or voice communications between at least two user terminals. This embodiment depicts a p2p network having five user terminals including a determined master terminal 100-$mh$, two determined slave terminals 100-$s1$, 100-$s2$ and two determined "hybrid terminals" 100-$h1$, 100-$h2$. Each of the hybrid terminals 100-$h1$, 100-$h2$ functions like the slave terminals previously described in the context of their communications with the other user terminals 100-$mh$, 100-$s1$, 100-$s2$; however, in communicating video and/or audio with each other they function similar to the previously described master terminal 100-$n$ of FIG. 1 in that such communications are directly transferred between them and are not sent via the master terminal 100-$mh$. In determining that user terminals 100-$h1$, 100-$h2$ are hybrid terminals, procedures and analyses are conducted like that done in the embodiments of FIGS. 1 and 13. That is, the peer-to-peer server 108 has responsibility for developing the contents of a data parameters table relying on known (test or predetermined) packet transfers involving all combinations of user terminals. The formed or determined data parameters table is then provided to the designated topology manager. The topology manager video/audio control software, including the algorithms or heuristics thereof, analyzes the relevant data and makes determinations regarding the topology of this particular network and, concomitantly, the identities of the master terminal(s), the slave terminal(s) and, in this embodiment, the hybrid terminal(s). After this particular p2p network is established, the basic steps of the video and/or voice communications among such terminals are comparable to those steps previously described in conjunction with the FIGS. 1 and 13 embodiments, except for the previously noted communications between the two determined hybrid terminals 100-h1, 100-h2.

In view of the descriptions involving these different embodiments, some rules concerning slave terminals and master terminals are noted. First, a slave terminal must connect to one and only one master terminal. Related to that, a slave terminal processes only its own data and sends or outputs only its own data. Secondly, a master terminal can connect to any number of slave terminals including no (zero) slave terminal. Thirdly, a master terminal must connect to all other master terminals, with the "net" associated with master terminals being fully interconnected. Fourth, a slave terminal may connect to one or more other slave terminals, so long as they all connect to the same master terminal (hybrid embodiment). Based on these rules, the route video/audio data takes from one player/user to another is unambiguous and no video and/or audio data passes through more than two master terminals.

With respect to the embodiments of FIGS. 1, 13 and 14 as well as any other peer-to-peer networks of the present invention, it should be understood that one or more user terminals 100 could be added after the initial establishment of a particular peer-to-peer system. Also, after they have become part of a particular peer-to-peer system, each user terminal thereof could drop out or be removed from that particular network. With respect to situations in which one or more user terminals 100 becomes part of a previously established peer-to-peer network, a new peer-to-peer system is established that includes the additional one or more user terminals 100. The establishment of this new, different network involves substantially the same steps and procedures that were previously described related to forming a peer-to-peer system, including the determination of the "selected fitness value" and the master terminal(s) associated therewith. Regarding such a determination, previously relied upon parameters of bandwidth, latency and terminal computational power can be taken into account for each terminal in the different or revised network. Updated or new data in the data parameters table is utilized. That is, new, relevant data is continuously included or provided in the table during the time that the established p2p network is operating (audio and/or video communications are occurring among the user terminals based on the initial topology determination) and determinations continue to be made related to any possible change to its initial or current topology. Preferably, further parameters are also considered, namely: the unreliability of the connections associated with each terminal that remains in the different network; and/or a comparison between the topology of the different network and the initial network topology; including the amount or degree of benefit in the event that one or more changes to the topology of the initial network are made. Unreliability of connections relates to how dependable and/or consistent data transmissions have been involving user terminals that were part of the initial network and which terminals will also be in the different, subsequent network. As should be understood, such unreliability can usually only be determined after the network (e.g. initial topology) has been in operation for a sufficient time. With regard to quantifying the unreliability factor, it is typically a binary representation, i.e. each user terminal is either determined to be reliable or unreliable. With respect to the comparison, it is usually better to have less, rather than more, topology changes when determining a master terminal for the different network. That is, it is preferable to arrive at a subsequent topology that is more like the initial network topology, which generally would result in less disruption in transitioning from the initial network to the subsequent network. Another factor for consideration related to the network topology concerns the benefit achieved associated with a particular subsequent topology. For example, if one slave terminal is dropped from the initial network and only one slave terminal is added, the determination may be that a new master terminal should be identified (i.e., the master terminal of the initial network should not be the master terminal of the subsequent network) because the use of a different master terminal results in a slightly improved topology. However, if the amount or degree of improvement fails to meet a predetermined or desired threshold (e.g. at least a 10% "improvement" over the initial topology including with its particular master terminal), then it might be determined that such a topology change is unwarranted, given the minor benefit and thus the master terminal is not changed from the initial topology.

Similar to the determinations of data parameters that were made when the initial or original of the particular network was formed, after the peer-to-peer server 108 completes creation of the data parameters table, the designated topology manager assumes responsibility for determining each master terminal and each slave terminal. Regarding one or more user terminals 100 no longer being part of the previously established peer-to-peer system, and depending on which one or more user terminals 100 are no longer part of such a network, determinations may be made with respect to the new network being established. In a previously established network in which the user terminal that discontinues being part of a second network is the designated topology manager, then a new topology manager must be selected from the user terminals that are part of the new network to be established. Similarly, if the user terminal 100 that discontinues being part of the previously established network is a master terminal, then a new master terminal is determined as previously discussed. In case of a particular slave terminal dropping out or being removed from the network, it may be that no network determinations need be made, other than that video and/or audio transfers no longer occur involving such a slave terminal.

With regard to the various stages or steps associated with video and audio communications that are illustrated by the blocks of FIGS. 5-10, it should also be understood that at least some of such steps can overlap or be conducted at the same time, if or when both audio and video are being communicated. That is, steps related to video and audio communications involving user terminals 100 can overlap or occur simultaneously, including processing of video and audio by the same user terminal 100.

The following provides in step, summary, outline and/or comment form additional or further descriptive information concerning the structures, routines and/or operations of the present invention:

PLAYERS JOINING & EXITING GAMES
P2PS—Voice & Video Peer-to-Peer Server
V&V NET—all nodes that are interconnected on the same Voice and/or Video Peer-to-Peer network
DPT—Data Parameters Table
Player 1 (P1)
    P1 is first to enter when he clicks on the web link, both the game client and P2P client are launched P1 game client connects to game server, passes the client credentials and is authenticated to play at a game with a given ID, since P1 is the first, game server spawns the game See ESTABLISHING CONNECTION BETWEEN GAME CLIENT AND P2P CLIENT P2P client connects to P2PS, passes the same client credentials to the P2PS and is authenticated to communicate with others associated with that game ID Player 2 (P2)

P2 clicks on the web link, both the game client and P2P client are launched

P2 game client connects to game server, passes the client credentials and is authenticated to play at the game with the given ID See ESTABLISHING CONNECTION BETWEEN GAME CLIENT AND P2P CLIENT P2P client connects to P2PS, passes the same client credentials to the P2PS and is authenticated to communicate with others associated with that game ID P2PS notes that there are unconnected P2P clients See ESTABLISHING A V&V NET OR ADDING A NODE Player 3 (P3)

P3 clicks on the web link, both the game client and P2P client are launched

P3 game client connects to game server, passes the client credentials and is authenticated to play at the game with the given ID See ESTABLISHING CONNECTION BETWEEN GAME CLIENT AND P2P CLIENT P2P client connects to P2PS, passes the same client credentials to the P2PS and is authenticated to communicate with others associated with that game ID P2PS notes that there are unconnected P2P clients See ESTABLISHING A V&V NET OR ADDING A NODE Player 4 (P4)

P4 clicks on the web link, both the game client and P2P client are launched

P4 game client connects to game server, passes the client credentials and is authenticated to play at the game with the given ID See ESTABLISHING CONNECTION BETWEEN GAME CLIENT AND P2P CLIENT P2P client connects to P2PS, passes the same client credentials to the P2PS and is authenticated to communicate with others associated with that game ID P2PS notes that there are unconnected P2P clients See ESTABLISHING A V&V NET OR ADDING A NODE Player 2

P2 drops out

Any node that notices an extended drop out notifies P2PS that P2 dropped out of the V&V Net See DROPPING A NODE

ESTABLISHING CONNECTION BETWEEN GAME CLIENT AND P2P CLIENT

Both the Flash Player and P2P client have a short list of port #s to use

P2P client attempts to open a socket until he finds one that opens (is not in use)

Flash Player attempts to open a net connection to P2P client. If port # tried does not work, it tries another one until he finds one that works or until it gives up after a period of time

VOICE & VIDEO OVER IP IN A PEER 2 PEER NETWORK

DELAY—for each node, a single delay value is calculated using the following measurements: the average, max and square coefficient of delay variations BANDWIDTH—there are two bandwidth measurements, in and out. The bandwidth measurement will be normalized (divided by) by the total number of video & audio channels coming in as well as going out NODE—basically each terminal is a node CHANNEL—each original source of data is a channel, a single channel can have audio and/or video data SUB-CHANNEL—a 1 byte sub-channel travels with the audio data. The sub-channel is reserved and used for controls and instructions, see Sub-Channel Formats MONO AUDIO—is always sent at full volume at which the originator sent it POSITIONING—in the case of stereo audio: L-audio and R-audio, in the case of quadraphonic audio: LF-audio, LR-audio, RF-audio and RR-audio VOICE ACTIVITY DETECTOR—an adaptive algorithm detects when someone is not talking.

VOICE PRESENT MAP—tells who's talking

TOPOLOGY MAP—8 bits, 1 for each other node (it does not include the destination node in the map).

AUDIO DATA FRAME—20 msec (0.020 sec), 32,000 hz (32,000 samples/sec) clock rate, 640 samples for each frame (0.020 sec*32,000 samples/sec). This is uncompressed audio, compressing the audio allows more space for video data to be sent in the same frame.

AUDIO CODEC to use is determined based on the bit rate quota for each node. Multiple audio codecs can be used in a single V&V Net. Those currently supported are a narrow band mono encoder, a wideband mono encoder, a wideband stereo encoder and a null encoder. The audio gets encoded as it is being put into a packet. All audio of a particular frame is processed first, then as much video for that frame that can be processed. This video is time stamped to allow more precise sync up with the audio data, this precise sync up always occurs at the final node.

FRAMES

Total length of a frame is determined by the sender's quota

Video is secondary to audio

Choice of audio codec determines how much audio space is needed

The balance between audio and video is chosen based on the quota

Low quality audio=~0-20% video

Med quality audio=~20-50% video

Hi quality audio=~50-100% video

Each packet has a frame number index and a packet index (there are multiple packets per frame)

When frames are sent, according to IP protocols, they are sent a packet at a time.

On the sending end, packets fill a frame, every 20 msec (0.020 sec) a frame is sent to the send process.

At the destination node, packets are stored in frame buffers. The audio frames are being constructed and stored on a channel by channel or a mixed/amalgamated basis. Once 20 msec worth of audio is stored for each channel, the audio frame buffers are output to speakers. The screen is updated with video data that corresponds in time to the audio data.

VIDEO FRAME DROPPING—WHEN NEW FRAMES ARRIVE:
  Any frame not fully received is dropped
    KEY FRAME (INTRA-FRAME)—all video frames in the buffer are dropped, except the one currently being sent to video output
    INTER-FRAME—all previously received droppable inter-frames are dropped, except the one currently being sent to video output
FULL QUALITY VIDEO—figures how many bytes per channel for video. We will generally use 80% of the highest computed video quality to ensure we don't constantly have to lose frames.
DATA PARAMETERS TABLE—the DPT stores measured values for a node struct RTT_Bandwidth
{
  unsigned short out_bandwidth[MAXNODES]; // Node to node uplink bandwidth (Kbits/second)
  unsigned short RTT[MAXNODES]; // Round trip delay (tenths of milliseconds)
  unsigned short total_in_bandwidth; // Total downlink bandwidth (Kbits/second)
  unsigned short unreliable_map; // Map of which connections are unreliable
  unsigned char horsepower; // How long the audio thread takes to do a significant portion of its work (in tenths of milliseconds)
};
FITNESS VALUE—for each candidate topology a single Fitness Value (the smaller the better) is calculated using the below noted values using each node. The Fitness Value of each candidate topology is used to determine an optimal topology.
  1. a calculated power mean (computer speed, a lower number is better)
  2. delay (latency)
  3. the smaller of the normalized bandwidth-in & -out of all connections
  4. node unreliability, can be determined as the V&V Net operates (sufficient data is generally not initially available to determine node unreliability and is not part of the initial Fitness Value calculations. As the V&V Net operates node unreliability is stored as a binary flag in the DPT)
  5. how many things would change if a new topology were implemented
CONNECTION RULES
  1. A slave terminal must connect to one and only one master terminal.
  2. A master terminal can connect to any number of slave terminals including no (zero) slave terminal.
  3. A master terminal must connect to all other master terminals, with the "net" associated with master terminals being fully interconnected.
  4. A slave terminal may connect to one or more other slave terminals, so long as they all connect to the same master terminal (hybrid embodiment).
  Based on these rules, the route video/audio data takes from one node to another is unambiguous and no video/audio data passes through more than two master terminals.
TOPOLOGY MANAGER
  Topology Manager makes a local copy of the DPT
  Pre-calculated tables exist that encompass the following:
    1. 3-6 nodes—all possible topology combinations, including hybrids
    2. 7 nodes—all possible topology combinations except hybrids
    3. 8-9 nodes—all possible topology combinations except hybrids and childless masters (masters with no slaves)
  When establishing a topology, the Topology Manager always tries configurations in this order:
    1. All nodes are masters
    2. All combinations of 1 master (worst case is n−1 tries, where n=the number of nodes)
    3. The rest of the cases in a pseudo random order (the table combinations are randomized and the start position is randomized as well resulting in a pseudo random order). In the cases of 7-9 nodes, hybrid cases are also tried for each table stored case.
  This design enables a very fast determination of the best topology. When time expires to pick a topology, the best of those searched is chosen.
TOPOLOGY MANAGER TOPOLOGY MANAGEMENT
  Requests periodic measurements from each of the nodes on the V&V Net. Requests and responses from and to the Topology Manager take the path of the channel communications. One by one, each with a single request, the Topology Manager requests each node to re-measure:
    1. Delay
    2. Bandwidth, unlike the P2PS, the Topology Manager is not under the same time constraint to establish a network, it allows more time for the bandwidth measurements. Nodes can "push" their bandwidth requirements up by pushing more data onto the V&V Net until congestion occurs, at which point it will back off a bit to determine the highest reliable bandwidth.
  The Non-Principal Nodes simply report their latest measurement data.
  As each node completes its measurement update, it updates its portion of the DPT and sends its portion of the DPT out to each of the other nodes via the sub-channel.
  Network characteristics (including delay and bandwidth measurements) can change with heavier traffic during different times of day, periodic outages, system maintenances, etc.
  Topology Manager periodically checks new topologies, even when nodes are not added or deleted. At times a new topology may in fact show itself to be better.
  In order for a new topology to be implemented, the Topology Manager weighs whether it is appreciably better to warrant the potential disruptions that changes inevitably cause.
V&V COMMUNICATIONS
BANDWIDTH QUOTAS
  Each node has a quota of how much data it is allowed to send per frame. The initial quota value is computed from the DPT by each node.
  After the V&V Net is running, each node can, on its own, try to push more data to those that is it communicates directly with if it determines it would like to send more data. If no congestion occurs, a node can increase its quota value.
  If at any time a node receives indication that there is congestion on the receiving end, it will back off the amount of data it is sending.
  Within intranets, no attempt is made to measure a max bandwidth quota, it is simply set very high.

On an intranet all nodes try to push the quota if they can't send as much as they'd like to, the recipient of data from an intranet will try to balance the data from the those intranet data senders.

Once quotas are established, the audio codec to be used and what rate that codec can run at is determined by each node. If needed the codec can be changed on a frame by frame basis. If the quota is high, a lot of the quota is dedicated to video. If the quota is low a bigger percent of the quota is dedicated to audio.

ESTABLISHING A V&V NET OR ADDING A NODE

ESTABLISH P2P COMMUNICATIONS AMONG THE NODES

1. When starting a V&V Net or adding a new node the P2PS instructs all nodes to start the ICE (Interactive Connectivity Establishment) process, which involves a Stun Server and various processes
2. All nodes pass ICE data to the P2PS
3. P2PS ensures the exchange of ICE data between all pairs of nodes that don't already have an established connection
4. Nodes that receive the exchange of ICE data try to establish the most reliable P2P connection with the node that the ICE data came from

OBTAIN DATA, POPULATE THE DPT, SEND A COPY OF THE DPT TO ALL NODES

5. P2PS instructs all nodes to calculate a power mean for their computer, to report which nodes that each is communicating with has an intranet address, additionally to measure and calculate a Delay between itself and all other nodes that are part of the V&V Net.
6. The nodes will determine which nodes on intranets will be Non-Principal Nodes. (The IP addresses obtained in the ICE process will indicate which nodes are on an intranet connection.) All nodes not on intranets will be Principal Nodes. One node on each intranet will be a Principal Node, all other nodes on intranets will be Non-Principal Nodes.
7. P2PS instructs all nodes on the V&V Net to measure and calculate bandwidth to each other node on the V&V Net.
8. Only new Principal Nodes will measure and respond with their bandwidth measurements. Existing Principal Nodes simply send their DPT (Data Parameters Table) bandwidth measurements. When measuring bandwidth, nodes only have a certain amount of time in which to report, a network that has just added a node must be established within a very short period of time.
   Bandwidth-out: each Principal Node stores a bandwidth-out measurement for each node on the V&V Net. Bandwidth-out to other Principal Nodes is measured. Bandwidth-out to Non-Principal Nodes is not measured, it is simply copied from the Principal Node on the corresponding intranet.
   Bandwidth-in: each Principal Node, and the Non-Principal Nodes on the same intranet, stores a bandwidth-in measurement that is measured from all other Principal Nodes and in the case of intranets the bandwidth-in is stored as a single total sum of bandwidth-in to the intranet.
9. After the Principal Nodes have completed making and/or sending their measurements to the P2PS, they inform the P2PS that they have completed their measurements. The Principal Nodes also inform the P2PS which nodes (the Non-Principal Nodes) will not be responding to the bandwidth measurement request.
10. When all Principal Nodes have been spoken for, the P2PS requests the Non-Principal Nodes to send their DPT stored bandwidth data.
11. All Non-Principal Nodes send bandwidth measurement data
12. P2PS populates a new DPT
13. P2PS sends the DPT to each node on the given V&V Net

DESIGNATE A TOPOLOGY MANAGER AND ESTABLISH A TOPOLOGY

14. P2PS designates a Topology Manager
15. P2PS instructs the Topology Manager to calculate a new topology
16. Topology Manager calculates a new topology
17. Topology Manager sends the new topology to the P2PS
18. Both the Topology Manager and the P2PS send the new topology to all nodes on the given V&V Net
19. Topology Manager sends a message to the P2PS that the transition to the new topology is completed

DROPPING A NODE

1. If the node that dropped out was the Topology Manager
   P2PS requests the latest individual DPT data from all nodes and populates a new DPT
   P2PS designates a new Topology Manager
   P2PS sends the new DPT to the new Topology Manager
2. P2PS instructs the Topology Manager to calculate a new topology
3. Topology Manager calculates a new topology
4. Topology Manager sends the new topology to the P2PS
5. Both the Topology Manager and the P2PS send the new topology to all nodes on the given V&V Net
6. Topology Manager sends a message to the P2PS that the transition to the new topology is completed

AUDIO IN

We resample audio to 32,000 hz
Run the audio through an echo canceller
Adjust volume based on a node's own volume control setting
Check for voice activity and check to see if the node is system or self-muted
Fades in really fast, fades out slower to minimize a popping when coming in/out
Updates a present bit

PROCESSING AUDIO AND VIDEO DATA

Each node gets audio data from other nodes, processes it, puts it in an array filling a frame for each channel
Once a frame's worth of audio data has accumulated from all channels, it gets handed off to the send process
The send process goes through each channel to see if that channel's audio should be forwarded to other nodes, checks how many bytes can be sent out (it's quota)
Slave nodes will only send their own data to the nodes they are connected to
Master nodes check which nodes it should send each channel to. In this process the master nodes will check to see if it should mix/amalgamate the audio and if it should
   a. Leave the audio as mono
   b. Synthetically make the audio stereo or
   c. Synthetically make the audio quadrophonic
In all cases, the slave and master encodes/compresses the audio before it is sent

FRAMES

When a SINGLE CHANNEL of audio is being sent (this occurs whenever a slave node sends to any of its connections):

It will always be sent using a mono encoder. It will only be converted to stereo or quadraphonic audio positioning upon mixing/amalgamation at a master node or at each final destination node for that channel.

When MULTIPLE CHANNELS of audio are being sent (only a master node sends multiple channels):
If Master to a Slave
  The master will perform a synthetic stereo or quadrophonic splitting of the mono audio signals from all other channels (except a destination slave's own channel will not be processed, nor will any other channels being sent to that destination slave from other slaves), perform volume control for each of these newly created audio signals, all of this audio will be mixed/amalgamated into R- & L-audio signals (LF-, LR-, RF- & RR- in the case of synthetically splitting into quadraphonic signals) and sent to the slave node using a stereo encoder if it has a stereo encoder that fits within the allowed quota. For the same quality audio on the receiving end, this mixing/amalgamating results in an approximate n-to-1 reduction in audio data for each of the R- and & L-audio signals (LF-, LR-, RF- & RR- in the case of synthetically splitting into quadraphonic signals). When these R- & L-audio signals are played out the slave node's speakers, the slave node will be able to perceive a spatial awareness of where others on V&V Net are in the game or on the battlefield in relation to itself.
If Master to a Master—audio from each channel will be forwarded in its original state, each as single channels using a mono encoder.

RECEIPT OF AUDIO BY A NODE THAT IS INTENDED TO BE PLAYED OUT ITS SPEAKERS
  Multiple Channels (these were sent from a master to a slave, but mixed/amalgamated into a stereo or quadraphonic encoded stream)
    Slave node simply decodes and outputs the audio to its speakers. Spatial awareness will occur due to the splitting, volume control and mixing done at the master.
  Single Channel
    The mono audio signals from all other nodes will be synthetically split into stereo or quadrophonic signals, volume control for each of these newly created audio signals will be performed, all of this audio will be mixed/amalgamated into R- & L-audio signals (LF-, LR-, RF- & RR- in the case of synthetically splitting into quadraphonic signals) and sent to this node's speakers.
  All nodes will be able to perceive a spatial awareness of where others on V&V Net are in the game or on the battlefield in relation to itself from such audio processing.

TOPOLOGIES
  Whenever a node is added or dropped, the P2PS will dictate that the Topology Manager must calculate a new topology. The Topology Manager will calculate a new topology, communicate the new topology to the P2PS, both the Topology Manager and P2PS will communicate the new topology to all nodes.
  The Topology Manager will request that the nodes periodically take new measurements to update the DPT. Based on these new measurements, the Topology Manager will evaluate whether a new topology is warranted. When the Topology Manager dictates that a new topology is warranted, the P2PS never gets involved.

TRANSITION PROCESS
1. With this design, all data received is processed regardless of the current topology. The topologies only matter when data is being sent out.
2. Every packet being sent will contain a Frame status, stored as a single bit
    0=Normal Frame status
    1=Transition Frame status
3. When the Transition Frame status is designated, a Transition Phase status will be stored as two bits
    00=R=Ready status
    01=T=Transition status
    10=E=Emergency Ready status
    11=X=Emergency Transition status
  The Ready and Transition statuses (R & T respectively) are states of a transition that was dictated by the Topology Manager after it found a better topology. The Emergency Ready and Emergency Transition statuses (E & X respectively) are states of a transition that was dictated after the P2PS noted that a new node was added or an existing node was dropped. The R and E statuses are essentially equivalent, the T and X statuses are essentially equivalent as well.
  As one can see, the E and X status values are higher than the R and T statuses. If the V&V Net is in a transition state and a node is added or dropped before the transition completes, an emergency transition will be dictated that will supersede the currently executing transition.
  Whenever an emergency transition is dictated, an emergency transition count is issued. These emergency transition counts start at zero and will increment by one with each ensuing emergency transition that is dictated while another emergency transition is being executed. All nodes will know that the most recent emergency transition is the one with the higher number. If an emergency transition completes, the next emergency transition dictated will again start with an emergency transition count of zero.
  All transition frames also contain the newest topology designated as well as the transition status of all nodes that have data in that frame.
  With this design, all nodes know with each frame received which topology is the latest. Since each transition frame contains the latest topology, all nodes always know where to send the recently received data and all nodes are updated on the transition status of each node in the V&V Net.
4. A transition proceeds as follows:
  For the sake of clarity, if a Normal Frame status is received, the nodes continue to use the current topology.
  When an R or E status is received, all subsequently started frames will be built with the same R or E transition status and include the new topology. Eventually, all nodes on the V&V Net will be sending frames with either the R or the E status.
  Whenever a node notes that all nodes on the V&V Net are on an R status, it immediately switches its frame status to the T status. Correspondingly, whenever a node notes that all nodes on the V&V Net are on an E status, it immediately switches its frame status to the X status.
  When a T or X status is received, all subsequently started frames will be built with the same T or X transition status and include the new topology. Eventually, all nodes on the V&V Net will be sending frames with either the T or the X status.

Whenever a node notes that all nodes on the V&V Net are on a T or X status, it immediately switches its frame status to the N status, which designates that the transition to the new topology is complete.

When an N status is received while the node is in the T or X status, each node that received a frame with such a designation immediately marks all subsequently started frames with the same N status.

HOW ALL NODES KNOW WHEN TO CHANGE STATES IN THE TRANSITION:
1. Two bits in the transition packets, Pure and Whole, track this. Both the Pure and Whole bits are cleared when the transition to R or E status occurs.
2. Each node will set the Pure bit in all subsequent packets it sends only when every node sending to it is in the same transition state it is in.
3. Each node will set the Whole bit in all subsequent packets it sends only when every node sending to it is in the same transition state it is in and has the Pure bit set.
4. A node knows that the R or E portion of the transition process is complete when every node sending to it has the Whole bit set. At this point that node resets the Pure and Whole bits and changes the transition process from the R or E status to the T or X status respectively.
5. Each node will set the Pure bit in all subsequent packets it sends only when every node sending to it is in the same transition state it is in.
6. Each node will set the Whole bit in all subsequent packets it sends only when every node sending to it is in the same transition state it is in and has the Pure bit set.
7. A node knows that the T or X portion of the transition process is complete when every node sending to it has the Whole bit set. At this point that node changes to use the Normal Frame.
8. Whenever a node is in a T or X state and receives a packet with a Normal Frame, it switches to using a Normal Frame as well.

PACKET FORMAT:
Layer 1, network management, one of the following:
  STUN message:
    3 bits: 000
    ? bits: STUN data
  Measure RTT query message:
    5 bits: 00100
    3 bits: message ID
    64 bits: message time
    8 bits: CRC-8 of previous 9 octets
  Measure RTT reply message:
    5 bits: 00101
    3 bits: message ID
    64 bits: message time
    8 bits: CRC-8 of previous 9 octets
  Measure input bandwidth reply message:
    5 bits: 00110
    3 bits: CRC-3 of congestion
    8 bits: congestion (percentage of packets not received by sender)
  Measure output bandwidth record message:
    6 bits: 001110
    2 bits: 00 reserved
  Low bitrate media packet: 1 byte plus layers 3-5
    2 bits: 01
    6 bits: packet index fragment, bits 13-18
    8 bits: congestion (percentage of packets not received by sender)
  High bitrate media packet: 4 bytes plus layers 2-5
    1 bit: 1
    1 bit: layer 2 (FEC) present; 0: no, 1: yes
    30 bits: packet index
    8 bits: congestion (percentage of packets not received by sender)
Layer 2, forward error correction (FEC), optional: 3 bytes
  5 bits: number of data packets in group
  5 bits: number of redundant packets in group
  6 bits: group index
  8 bits: number of bytes of aggregated audio data—1
Layer 3, frame management, one of the following:
  Normal frame: 2-3 bytes
    1 bit: 0
    1 bit: first packet in frame; 0: no, 1: yes
    1 bit: last packet in frame; 0: no, 1: yes
    13 bits: frame index
    if first packet in frame:
      8 bits: subchannel
  Transition frame: 2-12 bytes
    1 bit: 1
    1 bit: first packet in frame; 0: no, 1: yes
    1 bit: last packet in frame; 0: no, 1: yes
    13 bits: frame index
    if first packet in frame:
      2 bits: transition phase:
        00 R
        01 T
        10 E
        11 X
      1 bit: packet is whole; 0: no, 1: yes
      1 bit: number of node present indicators (NPIs):
        0 indicators for nodes 0-5
        1 indicators for nodes 0-9
      2 bits: NPI for node 0:
        00 node not present
        01 node present in network
        10 data not present (but normally would be)
        11 data present in packet
      2 bits: NPI for node 1
      2 bits: NPI for node 2
      2 bits: NPI for node 3
      2 bits: NPI for node 4
      2 bits: NPI for node 5
      if number of NPIs is 1:
        2 bits: NPI for node 6
        2 bits: NPI for node 7
        2 bits: NPI for node 8
        2 bits: NPI for node 9
      if transition phase is E or X:
        8 bits: topology count
        1 bit: packet is pure; 0: no, 1: yes
        network topology, one of the following:
          1 bit: 0 2-6 node graph
            14 bits: topology lookup table index
          3 bits: 100 7 node graph
            7 bits: interior node map
            21 bits: edge map
          3 bits: 101 8 node graph
            8 bits: interior node map
            28 bits: edge map
          2 bits: 11 9 node graph
            9 bits: interior node map
            36 bits: edge map Layer 4, data stream
  Individual audio/video data, zero or more times:
    1 bit: 1
    2 bits: data type:
      01 audio data
      10 video data, second through last fragment
      11 video data, first fragment
    if audio data:
      1 bit: private audio; 0: no, 1: yes
      4 bits: node ID (0-9)
      if private audio:
        8 bits: topology map of the excluded nodes (node ID bit removed)
      8 bits: number of bytes of audio data—1
      ? bits: audio data
    if video data, second through last fragment:
      1 bit: last video fragment; 0: no, 1: yes
      4 bits: node ID (0-9)
      9 bits: number of bytes of video data—1
      7 bits: video fragment number
      ? bits: video data
    if video data, first fragment (implied fragment number of zero):
      1 bit: last video fragment; 0: no, 1: yes
      4 bits: node ID (0-9)
      9 bits: number of bytes of video data—1
      15 bits: number of milliseconds to delay display (twos complement)
      ? bits: video data
  Aggregated audio data, one of the following:
  aggregated audio present:
    ? bits: aggregated audio data
    if second bit of aggregated audio data is 1:
      8 bits: topology map of the nodes with audio present (node ID bit removed)
  aggregated audio not present:
    6 bits: 100000
    2 bits: 00 reserved
  test message:
    4 bits: 1000
    2 bits: test command:
      01 send input bandwidth reply message
      10 send test messages, slow start
      11 send test messages, fast start
    2 bits: 00 reserved
    ? bits: random data
Layer 5, packet validity check: 4 bytes
  32bits: First 4 HMAC-MD5 digest bytes over the previous packet data
Notes: 1) If audio is present in a frame, the first packets in the frame will contain audio data.
  2) The low bitrate media packet can be used when there is only one packet in a frame and FEC is not wanted. The packet index is constructed as follows:
    bits 0-12: frame index
    bits 13-18: packet index fragment
    bits 19-29: implied
  3) Audio data always starts with a zero bit.
SUB-CHANNEL FORMATS:
  LSB of frame index: 0: Command/Notify
    Bits 3-1 of frame index: 000: Change volume command
      001: New volume value
      010: Delay/bandwidth measurement command
      011: Unreliable channel notification
      100: Change volume command
      101: New volume value
      110: Reserved
      111: Enabled video streams indication
    LSB of frame index: 1: Data
      Bits 6-1 of frame index: Data packet index
        0-50: Remote Volume/Delay/bandwidth data
        51-59: Local Volume data
        60-63: Reserved
    Change Volume command format:
      4 bits: 0000: No command
        Node ID+1: Node of next new volume value
      1 bit: Packet is pure; 0: no, 1: yes
      1 bit: Packet is whole; 0: no, 1: yes
      1 bit: Network transition complete; 0: no, 1: yes
      1 bit: 0: Reserved
    New volume value format:
      8 bits: Volume value
    Delay/bandwidth measurement command format:
      4 bits: 0000: No command
        Node ID+1: Command originator node
      4 bits: 0000: Abort measurement
        Node ID+1: Node to be measured
    Unreliable channel notification format:
      4 bits: 0000: No notification
        Node ID+1: Notification originator node
      4 bits: Channel ID: Unreliable channel
    Enabled video streams indication format:
      8 bits: Topology map of the enabled video output streams (with sending node bit removed)
    Remote Volume/Delay/bandwidth data packet:
      4 bits: 0000: No data
        Node ID+1: Data from remote node
      4 bits: 0000: Reserved
      8 bits: CPU speed
      16 bits: Unreliable channel map
      16 bits: Total input bandwidth
      For each node except the remote node (9 times):
        16 bits: Output bandwidth to node
        16 bits: Delay to node
      For each node except the remote node (9 times):
        8 bits: Volume of node
    Local Volume data packet:
      For each node except the local node (9 times):
        8 bits: Volume of node
AUDIO DATA FORMATS:
  Narrowband mono codec:
    1 bit: 0
    1 bit: channel audio present map follows codec data; 0: no, 1: yes
    1 bit: any audio present; 0: no, 1: yes
    1 bit: 0
    ? bits: codec data
  Wideband mono and stereo codec:
    1 bit: 0
    1 bit: channel audio present map follows codec data; 0: no, 1: yes
    1 bit: any audio present; 0: no, 1: yes
    2 bits: 10
    1 bit: 0: monaural stream
      1: stereo stream
    Audio data, one of the following:
      constant bit rate:
        1 bit: 0
        1 bit: 0 reserved
        ?/2 bits: first 10 ms of codec data
        ?/2 bits: second 10 ms of codec data
      variable bit rate:

```
1 bit: 1
1 bit: 0 reserved
n*8 bits: first 10 ms of codec data
? bits: second 10 ms of codec data
8 bits: n
```
Null codec:
```
8 bits: 00011000
```
Industry Standard wideband codec:
```
1 bit: 0
1 bit: channel audio present map follows codec data; 0:
  no, 1: yes
1 bit: any audio present; 0: no, 1: yes
5 bits: 11001
? bits: codec data
```
Video Data Formats:
Video codec:
```
4 bits: 0001: intra-frame
       0010: inter-frame
       0011: drop-able inter-frame
4 bits: 0010
? bits: codec data
```

The foregoing discussion of the invention has been presented for purposes of illustration and description. Further, the description is not intended to limit the invention to the form disclosed herein. Consequently, further variations and modifications commensurate with the above teachings, within the skill and knowledge of the relevant art, are within the scope of the present invention. The embodiments described hereinabove are further intended to explain the best modes presently known of practicing the invention and to enable others skilled in the art to utilize the same as such, or in other embodiments, and with the various modifications required by their particular application or uses of the invention. By way of example only, one or both of voice and video communications based on at least certain of the technological features provided herein could be implemented in a casino environment, such as among players of slot machines. Each slot machine could have video and audio input and output devices associated therewith for use by the player thereof. It may be that, instead of a p2p system being established among a determined number of such slot machines and their users, a central terminal or server might be utilized through which all communications are directed before passing them to the desired slot machine(s). It is also intended that the claims be construed to include alternative embodiments to the extent permitted by the prior art.

What is claimed is:

1. In a peer-to-peer system comprising a plurality of user terminals that includes at least a master and a number of slaves, including a first slave and a second slave, with each of the master and the number of slaves including a control for use in outputting at least one of audio data and video data, and further including at least one of an audio input device and a video input device, and at least one of an audio output device and a video output device, a method for communicating, comprising:

obtaining a number of possible topologies associated with the plurality of user terminals that includes at least a first possible topology and a second possible topology;

for each of said possible topologies, obtaining first-time data provided during a first time, using at least one data parameters table, related to each of the plurality of user terminals, with at least bandwidth being associated with said first-time data;

for each of said possible topologies, using at least one algorithm and said first-time data obtained using said at least one data parameters table to determine a fitness value;

for each said fitness value associated with a particular one of said possible topologies and which is determined using said at least one algorithm, identifying a selected fitness value and in which, after said identifying said selected fitness value, using a corresponding topology, with the master and the first and second slaves being determined, from said possible topologies that corresponds to said selected fitness value for communicating, while not using at least said first possible topology and said second possible topology for communicating;

wherein said first-time data relates to: (i) directly sending test data from the first slave to the second slave; (ii) directly sending test data from the second slave to the first slave; (iii) directly sending test data from the first slave to the master; (iv) directly sending test data from the master to the first slave; (v) directly sending test data from the second slave to the master; and (vi) directly sending test data from the master to the second slave;

wherein said using said corresponding topology includes: (a) said control of said first slave of said corresponding topology being used in sending at least one of audio data and video data, associated with a first bandwidth, to said master of said corresponding topology; and (b) said control of said first slave of said corresponding topology being used in sending at least test data associated with an increased bandwidth, with said increased bandwidth being greater than said first bandwidth, to said master of said corresponding topology when said control of said first slave determines that said test data associated with said increased bandwidth is able to be sent from said first slave to said master; and wherein at least said control of said first slave of said corresponding topology is used in providing, during a second time, second-time data to said at least one data parameters table, with at least a different bandwidth, different from said bandwidth associated with said first-time data, associated with said second-time data; and ascertaining whether said corresponding topology should continue to be used using said second-time data.

2. A method of claim 1 wherein the system includes a peer-to-peer server and a topology manager, and said method includes storing said first-time data in said at least one data parameters table using the peer-to-peer server and storing said second-time data in said at least one data parameters table using the topology manager.

3. A method of claim 1 wherein the master is a user terminal that has at least the following master functions:
   (i) provides its own audio data; and
   (ii) combines at least (a) audio data provided by at least one other user terminal and (b) its own audio data or audio data from a second other user terminal;

and each slave including the first slave and the second slave is a user terminal that has at least the following slave functions:
   (i) provides its own audio data; and
   (ii) processes only its own audio data, including not combining audio data from any other user terminal.

4. A peer-to-peer system for communicating, comprising:
a plurality of user terminals including at least a master and a number of slaves, including a first slave and a second slave, each of said plurality of user terminals including a control for use in controlling communications and for use in outputting at least one of audio data and video data;

at least a number of possible topologies associated with said plurality of user terminals, including at least a first possible topology and a second possible topology;

at least one data parameters table that stores at least first-time data provided during a first time and related to each of said plurality of user terminals, with at least bandwidth being associated with said first-time data;

wherein: (i) for each of said possible topologies, at least some of said first-time data is obtained using said at least one data parameters table; (ii) for each of said possible topologies, at least one algorithm is used, together with said at least some of said first-time data, to determine a fitness value; and (iii) a selected fitness value is found based on said fitness value determined for each of said possible topologies;

wherein, after said selected fitness value is found, a corresponding topology, with the master and the first and second slaves being determined, which is included with said possible topologies and that corresponds to said selected fitness value, is used for communicating, while at least each of said first possible topology and said second possible topology is not used for communicating;

wherein said first-time data relates to: (i) directly sending test data from the first slave to the second slave; (ii) directly sending test data from the second slave to the first slave; (iii) directly sending test data from the first slave to the master; (iv) directly sending test data from the master to the first slave; (v) directly sending test data from the second slave to the master; and (vi) directly sending test data from the master to the second slave;

wherein said control of said first slave of said corresponding topology is used in sending: (a) at least one of audio data and video data, associated with a first bandwidth, to said master of said corresponding topology; and (b) at least test data associated with an increased bandwidth, said increased bandwidth being greater than said first bandwidth, to said master of said corresponding topology when said control of said first slave determines that said test data associated with said increased bandwidth is able to be sent from said first slave to said master; and wherein said control of said first slave of said corresponding topology is used in providing, during a second time, second-time data to said at least one data parameters table, with at least a different bandwidth, different from said bandwidth associated with said first-time data, associated with said second-time data; and at least one of a peer-to-peer server and a topology manager which is used in ascertaining, using said second-time data, whether said corresponding topology should continue to be used.

5. A system of claim 4 wherein said peer-to-peer server is used to store said first-time data in said at least one data parameters table and said topology manager is used to store said second-time data in said at least one data parameters table.

6. A system of claim 4 wherein said at least one data parameters table includes said first-time data which is obtained using said peer-to-peer server and measurements associated with each of said plurality of user terminals, said measurements being made using transfers of said test data related to at least one of latency, computational processing power and said bandwidth associated with said first-time data.

7. A system of claim 4 wherein said number of possible topologies are stored using a topologies table.

8. A system of claim 4 wherein said number of possible topologies includes all of said possible topologies.

9. A system of claim 4 wherein said master is a user terminal that has at least the following master functions:
(i) provides its own audio data; and
(ii) combines at least (a) audio data provided by at least one other user terminal and (b) its own audio data or audio data from a second other user terminal;

and each slave including said first slave and said second slave is a user terminal that has at least the following slave functions:
(i) provides its own audio data; and
(ii) processes only its own audio data, including not combining audio data from any other user terminal.

10. A system of claim 4 wherein said control of said first slave generates a number of packets that include said at least one of audio data and video data and said increased bandwidth depends on packets not received.

11. A system of claim 10 wherein at least one of said number of packets includes at least one bit related to a percentage of packets not received.

12. A system of claim 4 wherein said control of said first slave is used in sending said at least one of audio data and video data to said master, together with said test data associated with said increased bandwidth, using a same packet.

13. A system of claim 4 wherein said at least bandwidth associated with said first-time data is said first bandwidth.

14. A system of claim 4 wherein said different bandwidth is said increased bandwidth.

15. At least one non-transitory computer readable medium storing at least one computer program for use in controlling communications among a plurality of user terminals including at least a master and first and second slaves, with each of the plurality of user terminals including a control for use in outputting at least one of audio data and video data, the computer program comprising instructions for:

providing at least a number of possible topologies associated with said plurality of user terminals, including at least a first possible topology and a second possible topology;

storing at least one data parameters table that includes first-time data provided during a first time and related to each of said plurality of user terminals, with at least bandwidth being associated with said first-time data;

for each of said possible topologies, obtaining at least some of said first-time data using said at least one data parameters table;

for each of said possible topologies, using at least one algorithm, together with said at least some of said first-time data, to determine a fitness value;

finding a selected fitness value based on said fitness value determined for each of said possible topologies; and using a corresponding topology, with the master and the first and second slaves being determined, which is included with said possible topologies and that corresponds to said selected fitness value, for communicating, while at least each of said first possible topology and said second possible topology is not used for communicating;

wherein said first-time data of said at least one data parameters table relates to: (i) directly sending test data from the first slave to the second slave; (ii) directly sending test data from the second slave to the first slave; (iii) directly sending test data from the first slave to the master; (iv) directly sending test data from the master to the first slave; (v) directly sending test data from the second slave to the master; and (vi) directly sending test data from the master to the second slave;

wherein said control of said first slave of said corresponding topology is used in sending: (a) at least one of audio data and video data, associated with a first bandwidth, to said master of said corresponding topology; and (b) at least test data associated with an increased bandwidth, with said increased bandwidth being greater than said first bandwidth, to said master of said corresponding topology when said control of said first slave determines that said test data associated with said increased bandwidth is able to be sent from said first slave to said master; and wherein said control of said first slave of said corresponding topology is used in providing, during a second time, second-time data to said at least one data parameters table, with at least a different bandwidth, different from said bandwidth associated with said first-time data, associated with said second-time data; and ascertaining whether said corresponding topology should continue to be used using said second-time data.

16. An at least one non-transitory computer readable medium of claim 15 wherein said first slave is a topology manager that is used to store said second-time data in said at least one data parameters table.

17. An at least one non-transitory computer readable medium of claim 15 wherein said at least one data parameters table includes said first-time data which is obtained using a peer-to-peer server and measurements associated with each of said plurality of user terminals, said measurements being made using said test data transfers related to at least one of latency, computational processing power and said bandwidth associated with said first-time data.

18. An at least one non-transitory computer readable medium of claim 15 wherein said control of said first slave generates a number of packets that include said at least one of audio data and video data and said increased bandwidth depends on packets not received.

19. An at least one non-transitory computer readable medium of claim 18 wherein at least one of said number of packets includes at least one bit related to a percentage of packets not received.

20. An at least one non-transitory computer readable medium of claim 15 wherein said control of said first slave is used in sending said at least one of audio data and video data to said master, together with said test data associated with said increased bandwidth, using a same packet.

21. An at least one non-transitory computer readable medium of claim 15 wherein said at least bandwidth associated with said first-time data is said first bandwidth.

22. An at least one non-transitory computer readable medium of claim 15 wherein said different bandwidth is said increased bandwidth.

* * * * *